United States Patent
Ohsuga

(10) Patent No.: US 7,414,332 B2
(45) Date of Patent: Aug. 19, 2008

(54) ELECTRIC POWER UNIT AND ELECTRONICS DEVICE OBTAINING POWER FROM A PLURALITY OF POWER SOURCES

(75) Inventor: Jun Ohsuga, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 151 days.

(21) Appl. No.: 11/151,423

(22) Filed: Jun. 14, 2005

(65) Prior Publication Data
US 2005/0275376 A1    Dec. 15, 2005

(30) Foreign Application Priority Data

Jun. 14, 2004   (JP)   ............................ 2004-174963
Jun. 14, 2004   (JP)   ............................ 2004-174986

(51) Int. Cl.
*H02J 1/00*   (2006.01)
*H02J 7/00*   (2006.01)

(52) U.S. Cl. ............................. 307/80; 320/138; 307/43

(58) Field of Classification Search ................. 320/138, 320/106; 307/44, 43, 80, 85–86; 369/277, 369/278; 396/277, 278
See application file for complete search history.

(56) References Cited

U.S. PATENT DOCUMENTS

| | | |
|---|---|---|
| 4,645,325 A | 2/1987 | Inoue et al. |
| 4,772,977 A | 9/1988 | Bottrell |
| 5,164,652 A | 11/1992 | Johnson et al. |
| 5,170,069 A | 12/1992 | Sakai |
| 5,182,546 A | 1/1993 | Shinbori et al. |
| 5,404,090 A | 4/1995 | Shinbori |
| 6,034,444 A | 3/2000 | Kuruma et al. |
| 6,064,176 A | 5/2000 | Odaka |
| 6,134,391 A * | 10/2000 | Takahashi .................... 396/277 |

(Continued)

FOREIGN PATENT DOCUMENTS

JP    60-66238    5/1985

(Continued)

OTHER PUBLICATIONS

Patent Abstracts of Japan, JP 2002-075387, Mar. 15, 2002.

(Continued)

*Primary Examiner*—Gary L Laxton
*Assistant Examiner*—Ramy Ramadan
(74) *Attorney, Agent, or Firm*—Oblon, Spivak, McClelland, Maier & Neustadt, P.C.

(57) ABSTRACT

An electric power unit selectable and usable a plurality of electric sources, including an electric source-discriminating device to detect attached electric sources of the plurality of electric sources, an electric source-selecting device to select one of the attached electric sources as a using electric source, at least one discharging device to discharge residual electric charges on electric source lines from the electric sources to the electric source-selecting device and/or electric source lines over the electric source-selecting device, and a control device configured to control the discharging device to discharge residual electric charges on the electric source lines where the electric sources are not connected or all electric source lines for a predetermined time or to a predetermined voltage, the electric source-discriminating device to discriminate the attached electric sources, and the electric source-selecting device to select the discriminated electric sources as the using electric source.

6 Claims, 18 Drawing Sheets

U.S. PATENT DOCUMENTS

| | | |
|---|---|---|
| 6,384,570 B2 | 5/2002 | Matsuyama |
| 6,437,536 B2 | 8/2002 | Higuchi |
| 6,625,401 B2 | 9/2003 | Kaedeoka |
| 2003/0184934 A1 | 10/2003 | Bushue et al. |
| 2003/0222504 A1 | 12/2003 | Priest |
| 2003/0222622 A1 | 12/2003 | Franke |
| 2004/0051385 A1 | 3/2004 | Song |
| 2005/0253560 A1* | 11/2005 | Popescu-Stanesti et al. . 320/138 |

FOREIGN PATENT DOCUMENTS

| | | |
|---|---|---|
| JP | 63-276320 | 11/1988 |
| JP | 7-59335 | 3/1995 |
| JP | 9-46914 | 2/1997 |
| JP | 11-84462 | 3/1999 |
| JP | 2000-19595 | 1/2000 |
| JP | 2000-19598 | 1/2000 |
| JP | 2000-324818 | 11/2000 |
| JP | 2001-211569 | 8/2001 |

OTHER PUBLICATIONS

"Method for Determining Battery Type and Remaining Battery Life" IBM Technical Disclosure Bulletin, vol. 40, No. 4, XP-000728309, Apr. 1997, pp. 191-193.

* cited by examiner

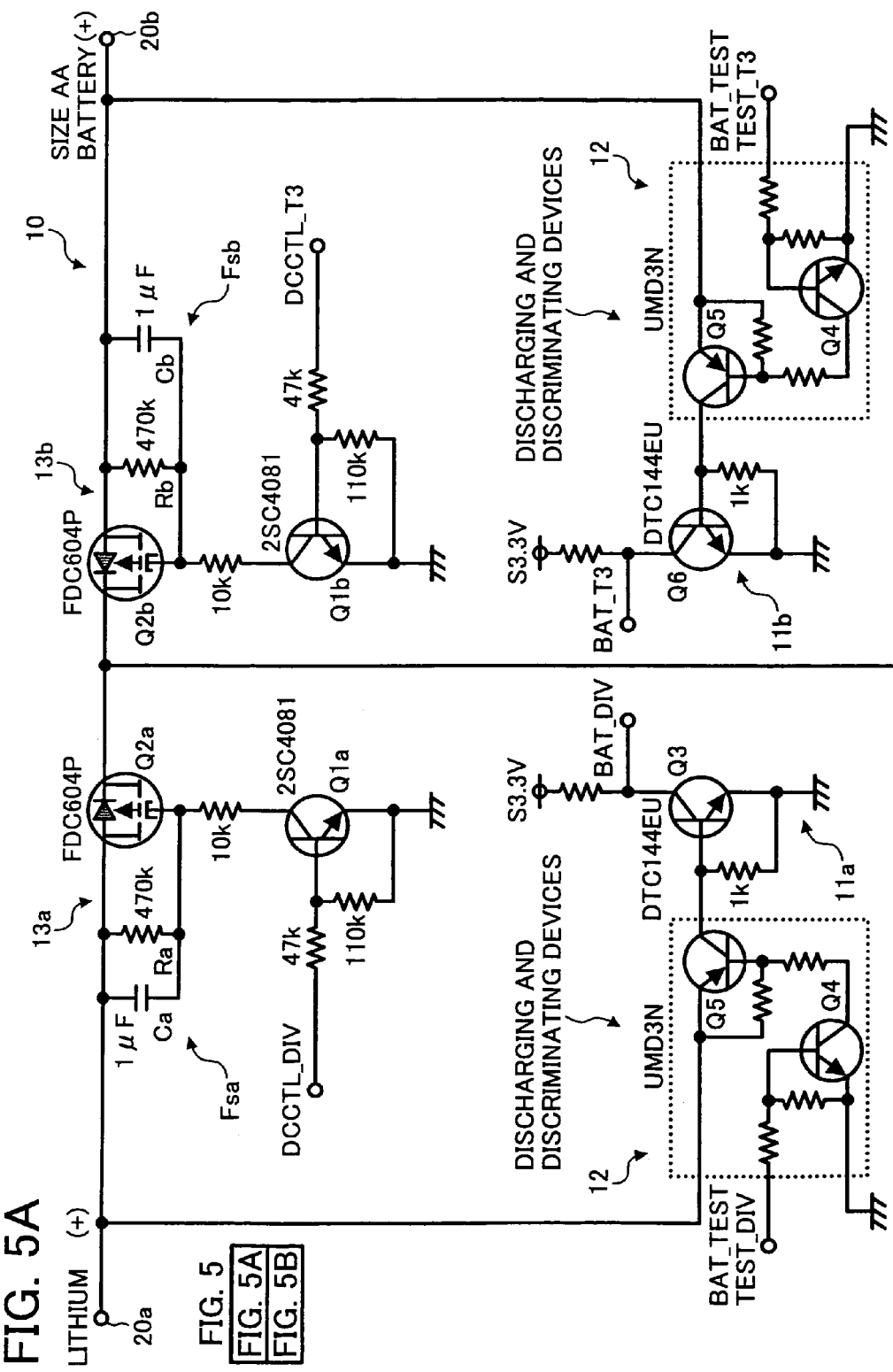

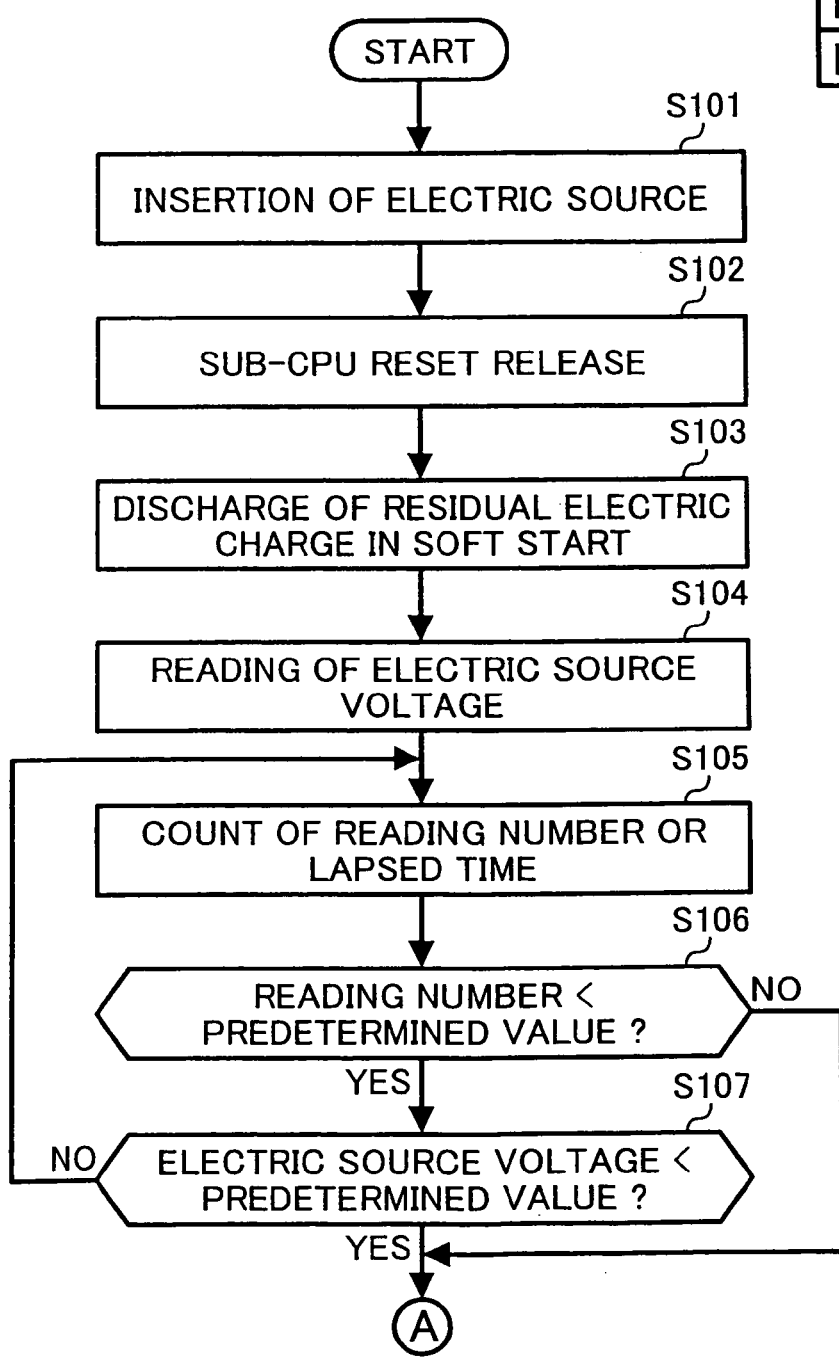

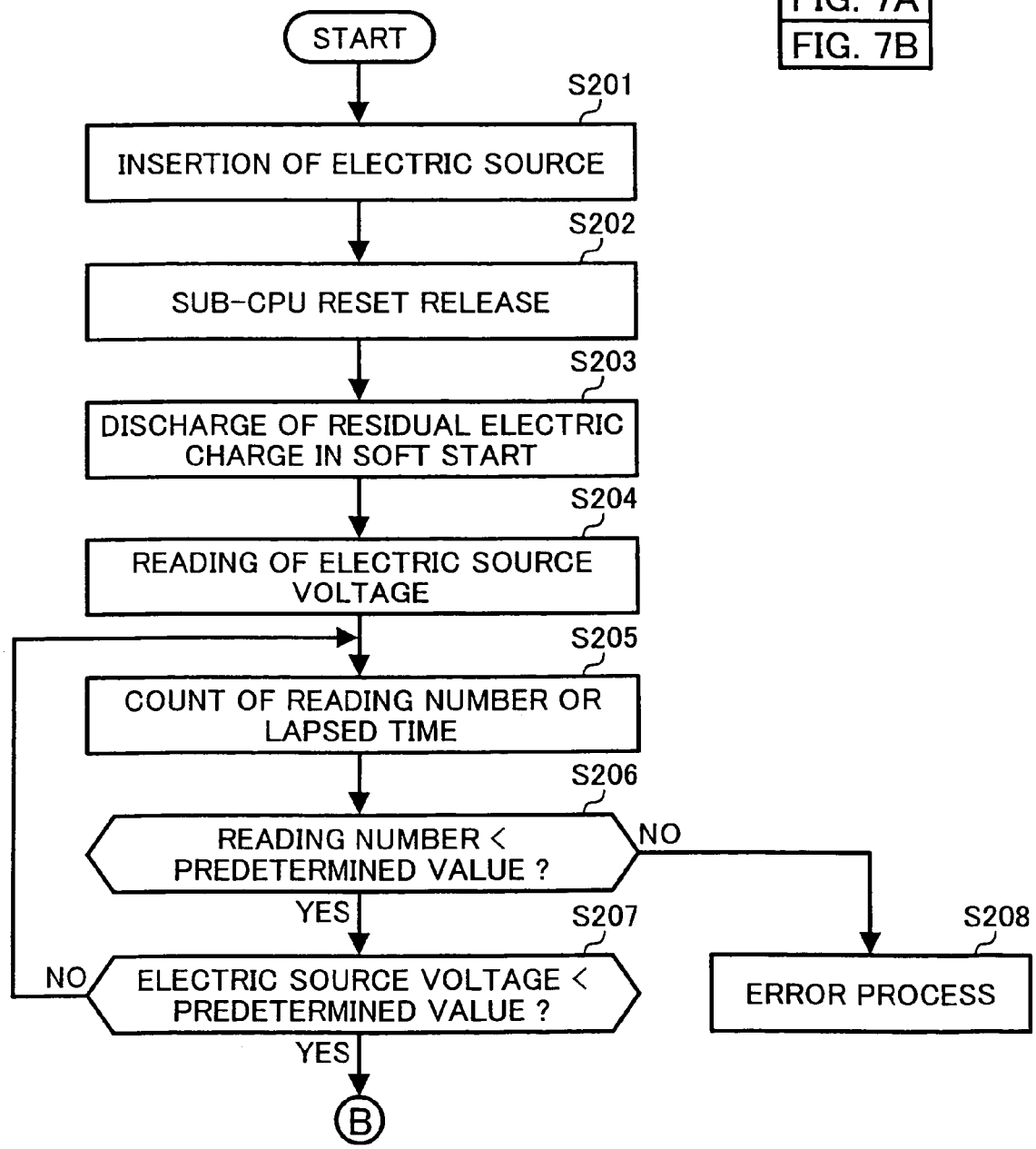

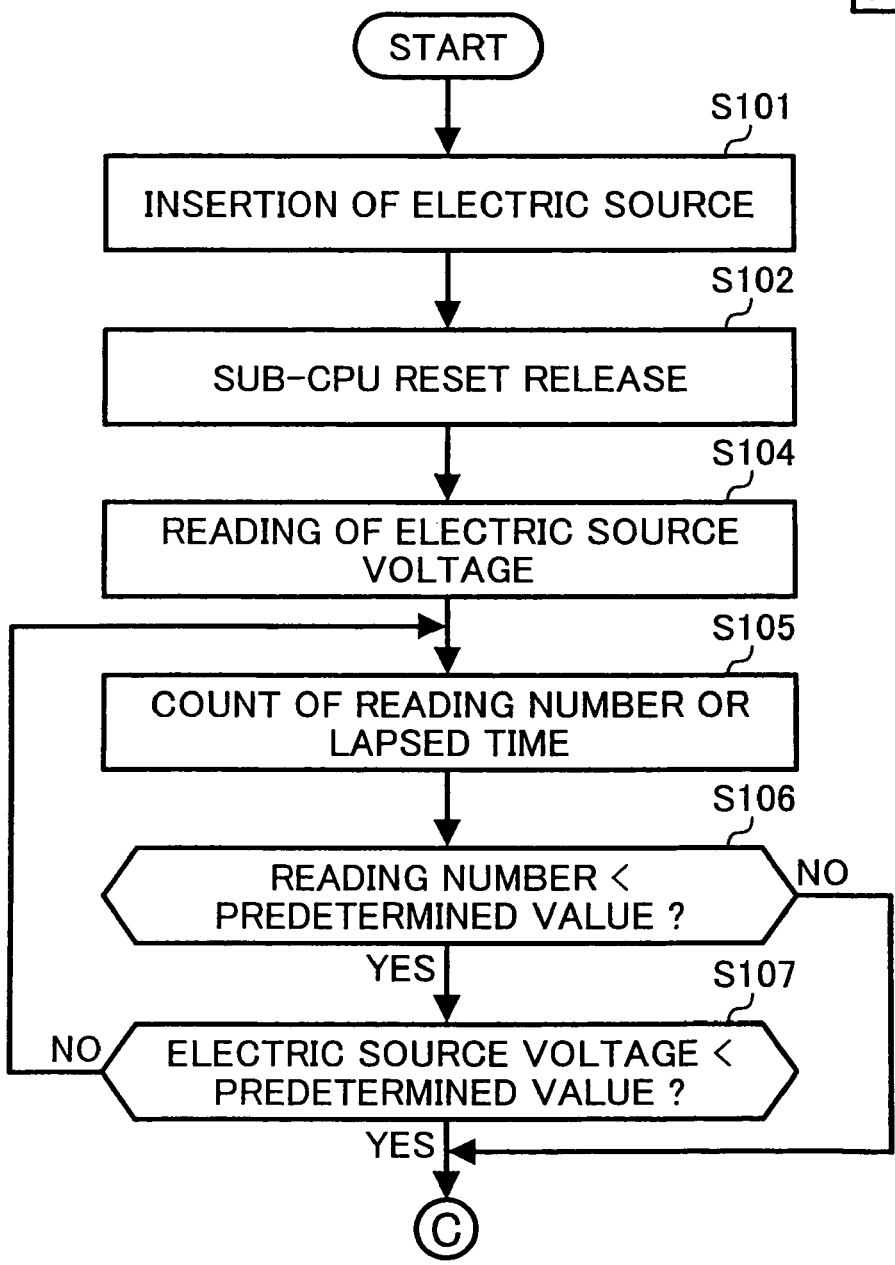

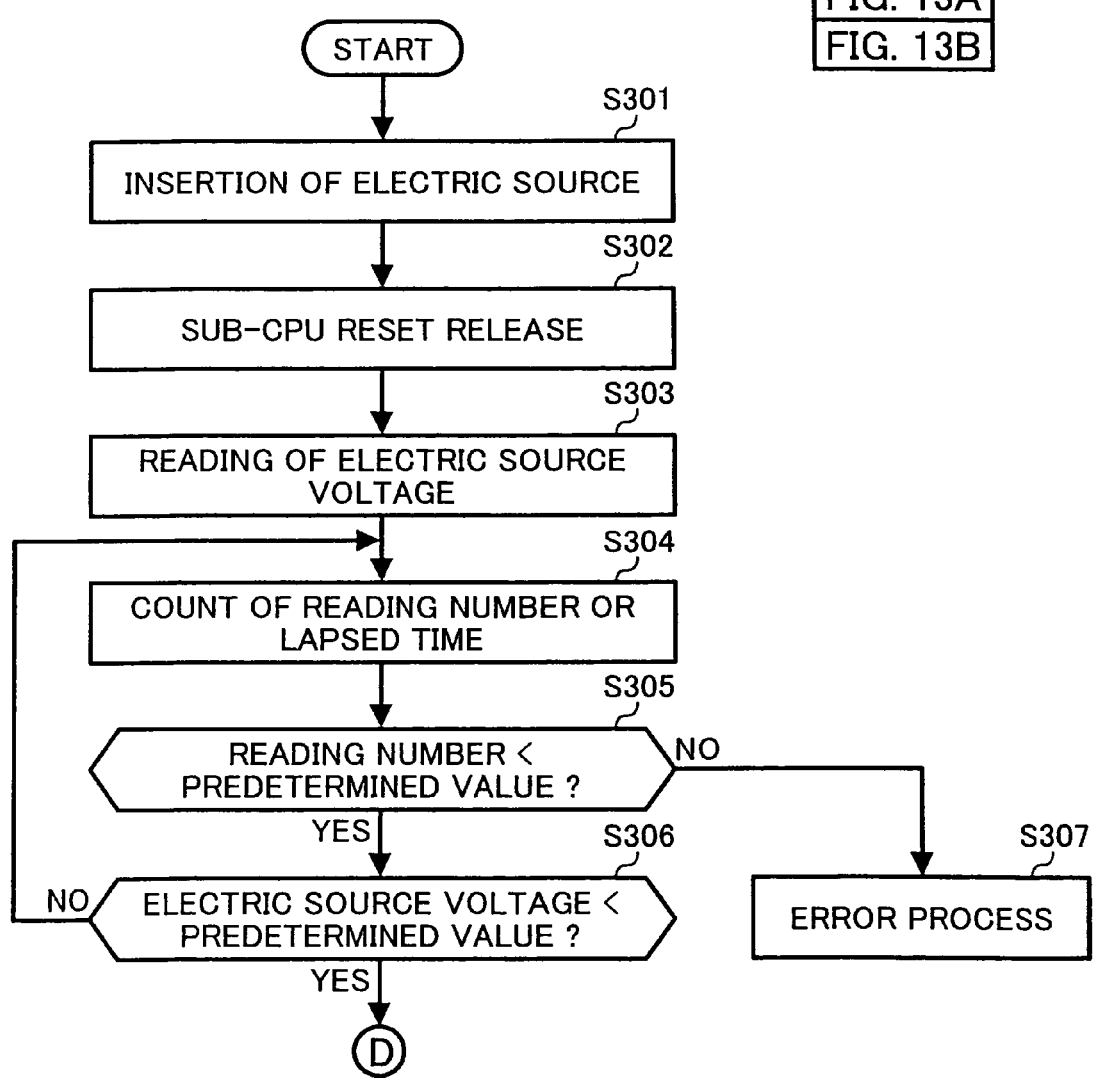

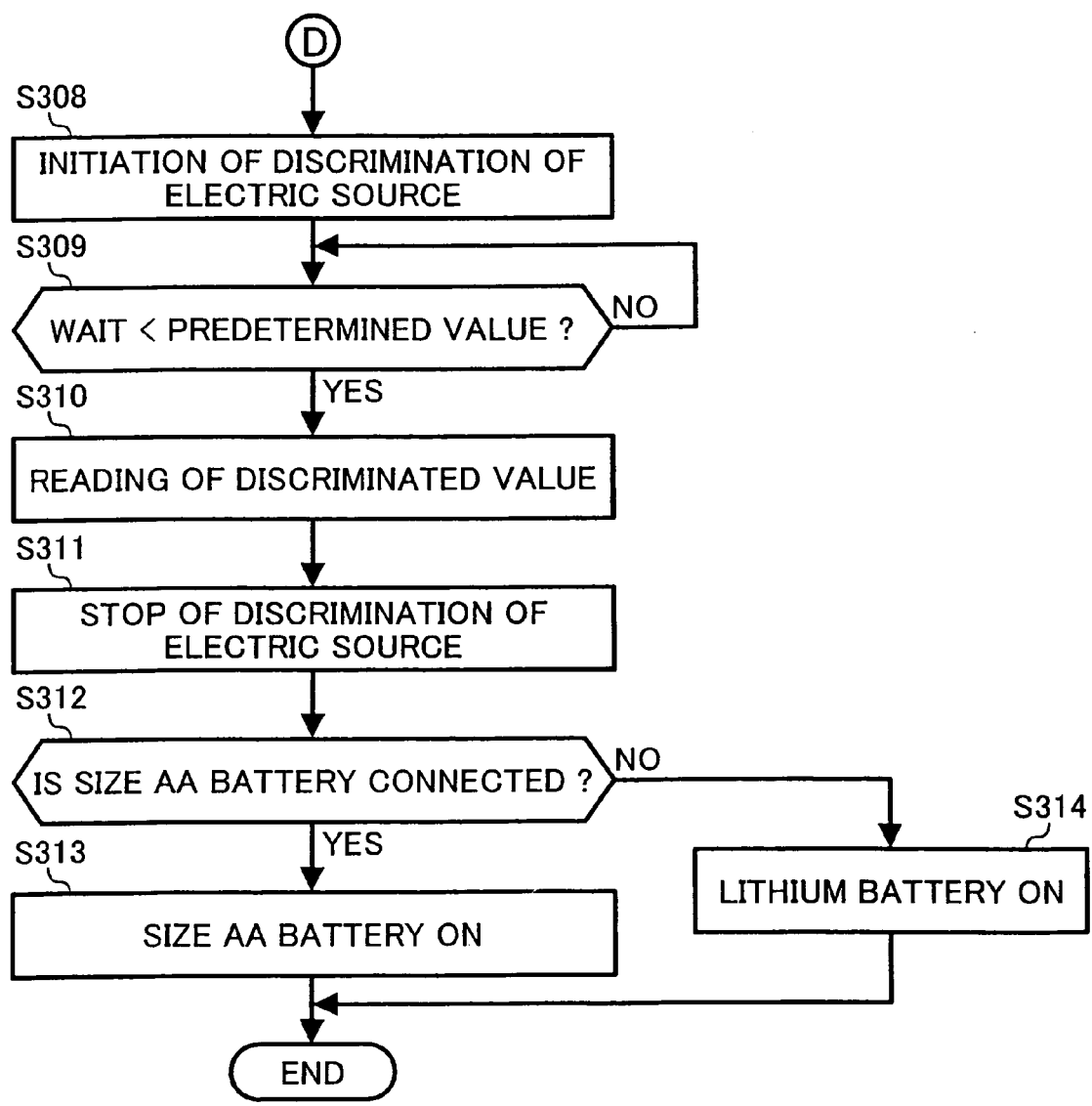

ELECTRIC POWER UNIT AND ELECTRONICS DEVICE OBTAINING POWER FROM A PLURALITY OF POWER SOURCES

CROSS-REFERENCE TO THE RELATED APPLICATION

The application claims the priority benefit of Japanese Patent Applications No. 2004-174963 filed on Jun. 14, 2004, and No. 2004-174986 filed on Jun. 14, 2004, the entire descriptions of which are incorporated herein by reference.

BACKGROUND OF THE INVENTION

1. Field of the Invention

The present invention relates to an electric power unit and an electronics device, more specifically to an electric power unit and an electronics device in which of a plurality of attachable and detachable electric sources by accurately discriminating which of electric sources are mounted, thereby electric supply can be achieved safely.

2. Description of Related Art

Recently, in an electronic device such as a digital camera or the like, there have been used selectively a plurality of electric sources in which various batteries and AC power supplies are converted in DC by an adapter.

For an electronic device which uses a plurality of electric sources, a size AA type-alkali manganese battery as a primary battery and a secondary battery such as a chargeable Ni-Cd (Nickel Cadmium) battery or lithium battery, for example, and so on can be often used. In the electronic device usable the plurality of electric sources in this way, discriminating a kind of the used electric sources is required to utilize a performance of the used electric sources adequately and prevent generation of accidents such as smoking, ignition, explosion or the like.

Therefore, conventionally, there has been proposed an electronic device usable plural kinds of batteries selectively having a means for discriminating kinds of batteries used, and a means for switching supplied currents of the batteries in accordance with discriminated results of the discriminating means (for reference, see JP H 11-84462 A).

Moreover, conventionally, there has been proposed a camera for displaying a loading state by discriminating which of batteries is loaded when one battery which is the same as the other batteries in outer shape, while has different electric characteristic is selected and contained in a battery storage chamber (for reference, see JP 2000-19595 A).

The Applicant has proposed previously an electronic device (for reference, see JP H 7-59335 A) in which an electric source-storage portion and an input terminal for a direct-current power source are provided, either a battery electric source configured to assemble a battery or an AC adapter for converting a commercial alternating current into a predetermined direct-current voltage can be contained in the electric source-storage portion interchangeably, and the input terminal is not used when the AC adapter is used so that the direct-current power source from the input terminal is not applied to a main circuit.

That is to say, the conventional technology makes it possible to charge the battery even when operating the battery electric source and form an electric power unit which does not occupy a space even when operating the commercial power source, and is structured to prevent malfunction and breaking of the circuit from occurring by a current out of the ordinary being applied from the input terminal when the AC adapter is used.

However, in the above-mentioned conventional arts, discriminating the used electric source of the plurality of electric sources is carried out, but solution at the time the discrimination for the used electric source is incorrect is not considered, an improvement in safety of the electric power unit, in particular, prevention of the accident such as the smoking, ignition and explosion or the like is required.

SUMMARY OF THE INVENTION

Therefore, an object of the present invention is to provide an electric power unit, which is capable of discriminating presence or absence of connection of an electric source rapidly and accurately, and is safe even if the discrimination is incorrect, and an electronics device including the electric power unit.

To accomplish the above object, an electric power unit according to one embodiment of the present invention includes at least one electric source, an electric source line connected to the electric source, and a discriminating device connected to the electric source line. The discriminating device is configured to determine whether the electric source is connected to the electric source line.

An electric power unit according to another embodiment of the present invention includes a plurality of electric sources, a plurality of electric source lines connected to the plurality of electric sources, respectively, and a discriminating device connected to the electric source lines. The discriminating device is configured to determine whether which of the plurality of electric sources is connected to the corresponding electric source line.

BRIEF DESCRIPTION OF THE DRAWINGS

FIG.5A and 5B show statements are circuit structural views showing by the composite views the electric power unit shown in FIG. 2, in which parasitic diodes of MOSFETs in the electric source-selecting device are opposite to a normal direction.

FIG. 13 is a flow chart showing still another embodiment of the process for the electric source with the error-process in the electric power unit shown in FIGS. 8 to 11.

DETAILED DESCRIPTION OF THE PREFERRED EMBODIMENTS

Preferred embodiments of the present invention will be explained in detail with reference to the accompanying drawings below.

Because embodiments described hereinafter are the preferred embodiments of the present invention, various technically preferred limitations are made to the embodiments, but the present invention is not limited to the embodiments.

FIGS. 1 to 6 illustrate a first embodiment of an electric power unit and an electronics device according to the present invention.

Figure 1:
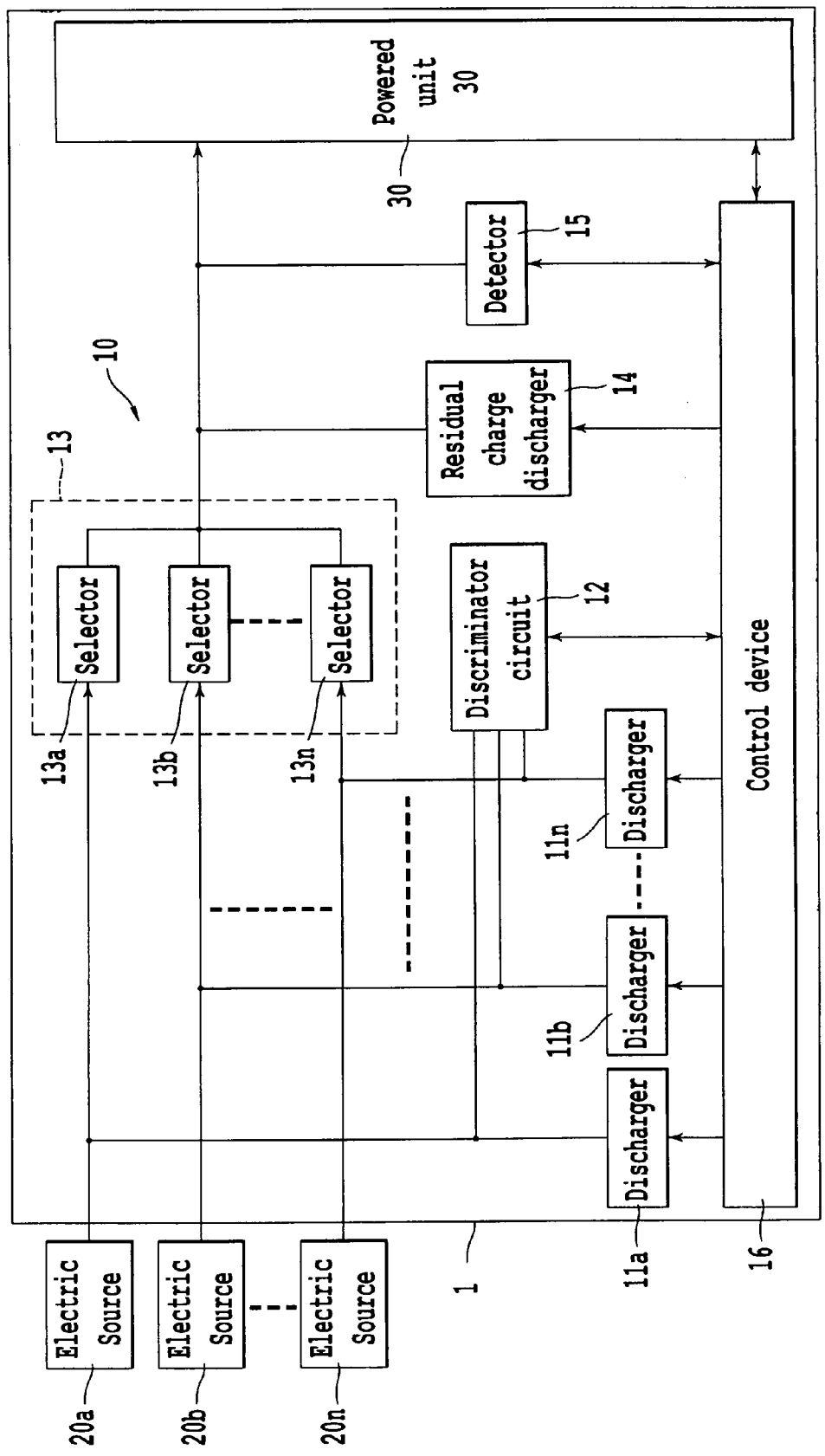
FIG. 1 is a block view of a substantial part of an image recording device to which one embodiment of an electric power unit and an electronics device according to the present invention is applied.

In FIG. 1, the electronics device includes an image-recording device 1 for recording an image such as a digital still camera, a copying machine, a printer or the like, and comprises an electric source part or electric power unit 10, a plurality of electric sources 20a to 20n connected with the electric power unit 10, and other unit 30 such as a display or sound part or the like, to which electricity is supplied from the electric power unit 10.

The electric power unit 10 includes one or more discharging circuits or discharging devices 11a to 11n having the number corresponding to the number of the electric sources 20a to 20n, an electric source-discriminating device 12, an electric source-selecting device 13, a discharging circuit or discharging device 14, a detecting circuit or residual-charge detecting device 15 and a control device 16 and so on.

The electric source-selecting device 13 includes selecting circuits 13a to 13n, which have the number corresponding to the number of the plurality of electric sources 20a to 20n and are connected with the electric sources 20a to 20n, respectively, and other unit 30 to supply electricity from the selected electric sources 20a to 20n to the other unit 30. The electric source-selecting device 13 has soft start function utilizing the buildup of charges, as described below.

The electric source-discriminating device 12 determines presence and absence of mounting of each of the electric sources 20a to 20n and outputs the determined result to the control device 16. The control device 16 controls the selecting circuits 13a to 13n and the discharging devices 11a to 11n based on the determined result of the electric source-discriminating device 12, hence controls selection and discharge of the electric sources 20a to 20n.

Each of the discharging devices 11a to 11n is connected between each of the electric sources 20a to 20n and each of the selecting circuits 13a to 13n and adapted to conduct the operation for ON-OFF under the control device 16 to discharge residual electric charges on the electric sources 20a to 20n and electric source-lines of the electric sources 20a to 20n.

The discharging device 14 is connected between the electric source-selecting device 13 and the other unit 30, and adapted to conduct the operation of ON-OFF under the control device 16 to discharge residual electric charges on an electric source-line between the source-selecting device 13 and the other unit 30.

The residual electric charge-detecting device 15 detects presence and absence of the residual electric charge on the electric source line from the electric source-selecting device 13 to the other unit 30, and outputs the detected result to the control device 16. The control device 16 controls discharged operation of the discharging device 14 based on the detected result for the residual electric charge by the residual electric charge-detecting device 15.

The control device 16 includes a CPU (Central Processing Unit), a program controlling the operation of the image recording device 1 and the electric power unit 10, a ROM (Read Only Memory) storing required data, a RAM (Random Access Memory) and so on, for example. The CPU utilizes the RAM as a work memory based on the program in the ROM and controls each part of the image recording device 1 to execute a process of the image recording device and controls each part of the electric power unit 10 to execute an electric source-controlling process, which will be described hereinafter.

Figure 2:
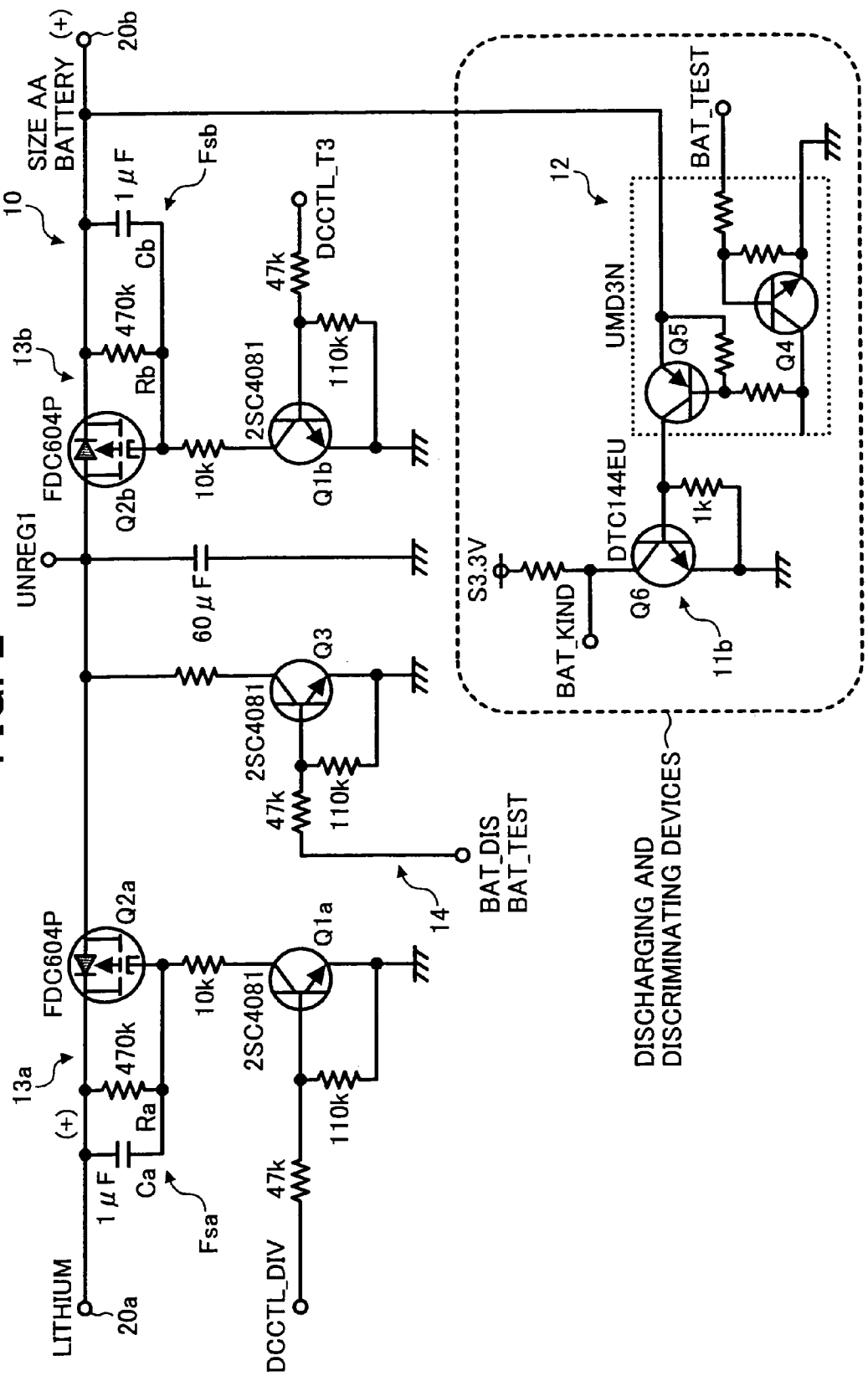
FIG. 2 is a circuit structural view of the electric power unit showing a state in which attached electric sources are lithium batteries or size AA batteries and having a soft start function.

The electric power unit 10 is structured as shown in FIG. 2 if a lithium battery is used for the electric source 20a and a size AA battery is used for the electric source 20b, each of the electric sources 20a and 20b is connected through each of the selecting circuits 13a and 13b of the electric source-selecting device 13 with an UNREG 1 of the other unit 30 as a load. The discharging device 14 is connected with the electric source line of the electric source 20a which is the lithium battery downstream the selecting circuit 13a, in other words, between the selecting circuit 13a and the UNREG 1. A discriminating and discharging device assembling the electric source-discriminating device 12 and the discharging device 11b is connected with the electric source line of the electric source 20b which is the size AA battery upstream the selecting circuit 13b, in other words, between the selecting circuit 13b and the electric source 20b.

The selecting circuits 13a and 13b include transistors Q1a and Q1b (2SC4081 and so on) for amplifying a small signal in order to amplify control signals, DCCTL_DIV, DCCTL_T3 and so on from the control device 16, for example, MOSFETs or Field Effect Transistors Q2a and Q2b turned on/turned off by the transistors Q1a and Q1b to connect and block the electric source 20a of the lithium battery and the electric source 20b of the size AA battery, respectively, a soft start functional part Fsb comprising a resistor Ra and a condenser Ca connected in parallel with the MOSFETs Q2a and Q2b for achieving a soft start function, a soft start functional part Fsb comprising a resistor Rb and a condenser Cb, and so on.

The MOSFETs Q2a and Q2b are turned on and turned off by the control signals, DCCTL_DIV, DCCTL_T3 from the control device 16 to the transistors Q1a and Q1b to execute the connection/blocking of the electric source lines, the soft start function is achieved by the soft start functional part Fsa comprising the resistor Ra and the condenser Ca and the soft start functional part Fsb comprising the resistor Rb and the condenser Cb, when the transistors Q2a and Q2b are turned on.

Here, the soft start function means limiting an incoming current exceeding supplying ability of the electric source when the selecting circuits 13a and 13b are turned on to prevent the electric power unit 10 from being inoperative for the reason that the incoming current flows to a load connected with the backwardly disposed UNREGU 1 so that a voltage of the electric source is dropped, when the selecting circuits 13a and 13b are turned on.

When any charges remain in the condensers Ca and Cb of the soft start functional parts Fsa and Fsb for performing the soft start function, even if the control device 16 outputs an OFF signal to the selecting circuits 13a and 13b, the selecting circuits cannot be turned off and remain conducted, hence there is a possibility that incorrect discrimination for the electric sources is carried out. Therefore, the electric charges in the soft start functional parts Fsa and Fsb are discharged, as described hereinafter.

Meanwhile, the MOSFETs Q2 and Q2b have parasitic diodes directions of which is opposite to a normal direction from the electric sources 20a and 20b to the UNREG 1 which is a load.

In addition, the discharging device 14 includes a transistor Q3 for amplifying a small signal and so on. The transistor Q3 is turned on in accordance with discharging signals (BAT_DIS, BAT_TEST) from the control device 16 to discharge electric charge on an electric source line downstream the selecting circuit 13a.

The electric source-discriminating device 12 uses epitaxial planar type-transistors Q4 and Q5, for example, starts the discriminating operation by the a test signal BAT_TEST from the control device 16, determines as to whether the type of the connected electric source is the lithium battery or the size AA battery, outputs the discriminated result to the control device 16, inputs the signal BAT_KIND showing the kind of the electric source into a collector of a transistor Q6 of the discharging device 1b, and further inputs a control signal into a base of the discharging device 11b.

The discharging device 11b is turned on according to the determined result of the electric source-discriminating device 12 to discharge charge on the electric source line on the size AA battery which is the electric source 20b and on the electric source line from the size AA battery to the selecting circuit 13a.

Meanwhile, the signal BAT_KIND is input as "High" when the size AA battery is used as the electric source 20b, shifts from "High" to "Low" when the discharging device 11b is turned on, and held to the High when the size AA battery is not used as the electric source 20b.

Figure 3:
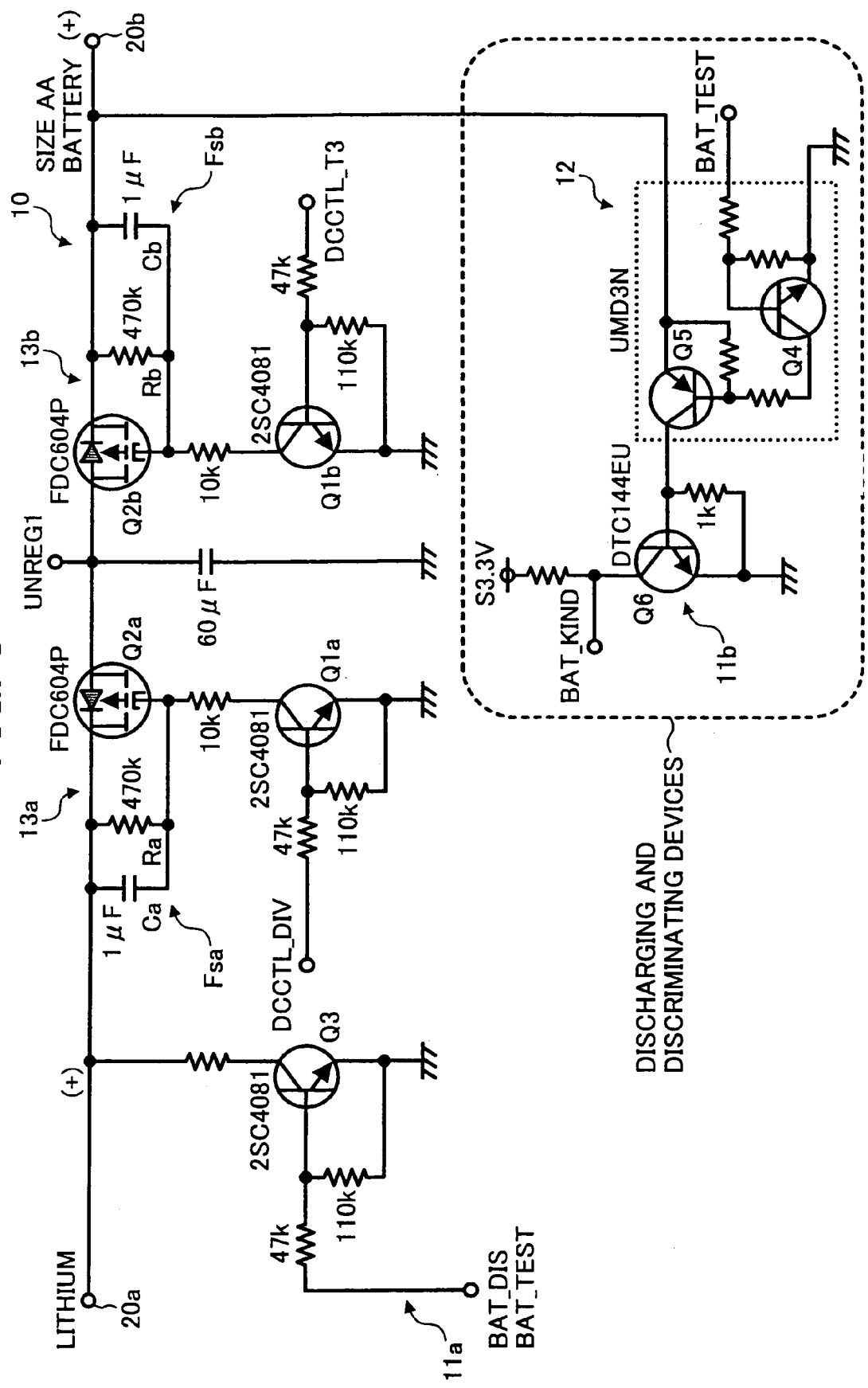
FIG. 3 is a circuit structural view of the electric power unit showing a state in which a discharging device beside the lithium batteries in FIG. 2 is disposed closer to the lithium batteries than an electric source-selecting device.

In addition, although a case in which a discharging device close to the electric source 20a which is the lithium battery in the electric power unit 10 comprises the discharging device 14 disposed downstream the selecting circuit 13a, namely, between the selecting circuit 13a and the UNREG 1 has been described, as shown in FIG. 2, the discharging device 14 close to the electric source 20a may be the discharging device 11a connected between the electric source 20a and the selecting circuit 13a, as shown in FIG. 3, a structure of the discharging device 11a itself is the same as the discharging device 14 to achieve the discharge the charges on the size AA battery which is the electric source 20a and the electric source line from the size AA battery to the selecting circuit 13a.

Figure 4:
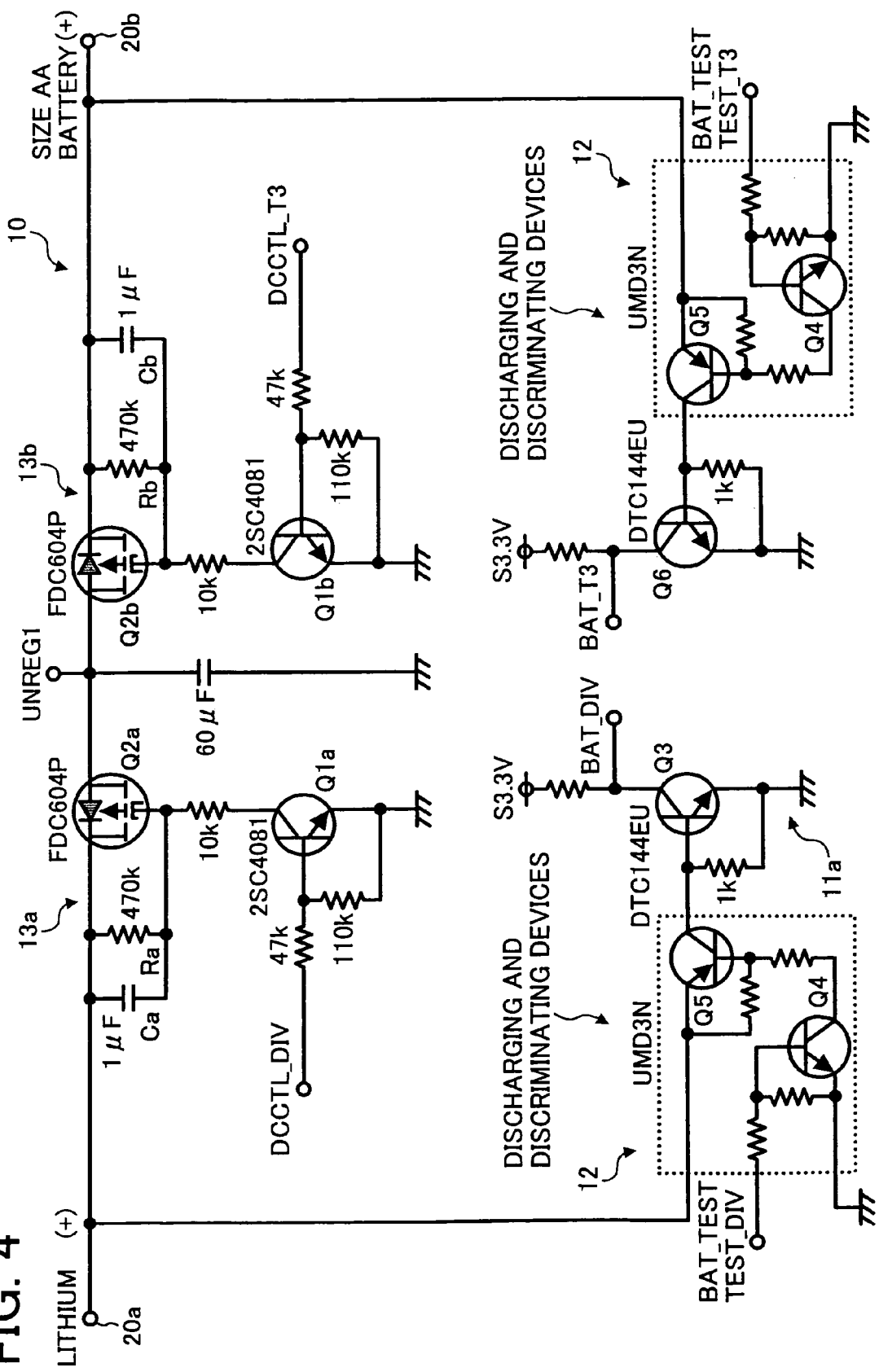
FIG. 4 is a circuit structural view showing the electric power unit shown in FIG. 2, in which the discharging device includes an electric source-discriminating device.

Moreover, the electric power unit 10 is not limited to the matter that the discharging device and the electric source-discriminating device are connected with only the electric source 20a used as the size AA battery, as shown in FIGS. 2 and 3, for example, a discriminating and discharging unit combining the electric source-discriminating device 12 and the discharging device 11a may be connected upstream the selecting circuit 13a, in other words, between the selecting circuit 13a and the electric source 20a or downstream the selecting circuit 13a, as shown in FIG. 4. The electric source-discriminating device 12 in the discriminating and discharging unit has the same structure as the electric source-discriminating device 12 connected with the electric source 20b shown in FIGS. 2 and 3, the explanation is omitted by attaching the same reference number thereto. The discharging device 11a is also the same as the discharging device 11a shown in FIG. 3, the explanation is omitted by attaching the same reference number thereto.

Figure 5B:
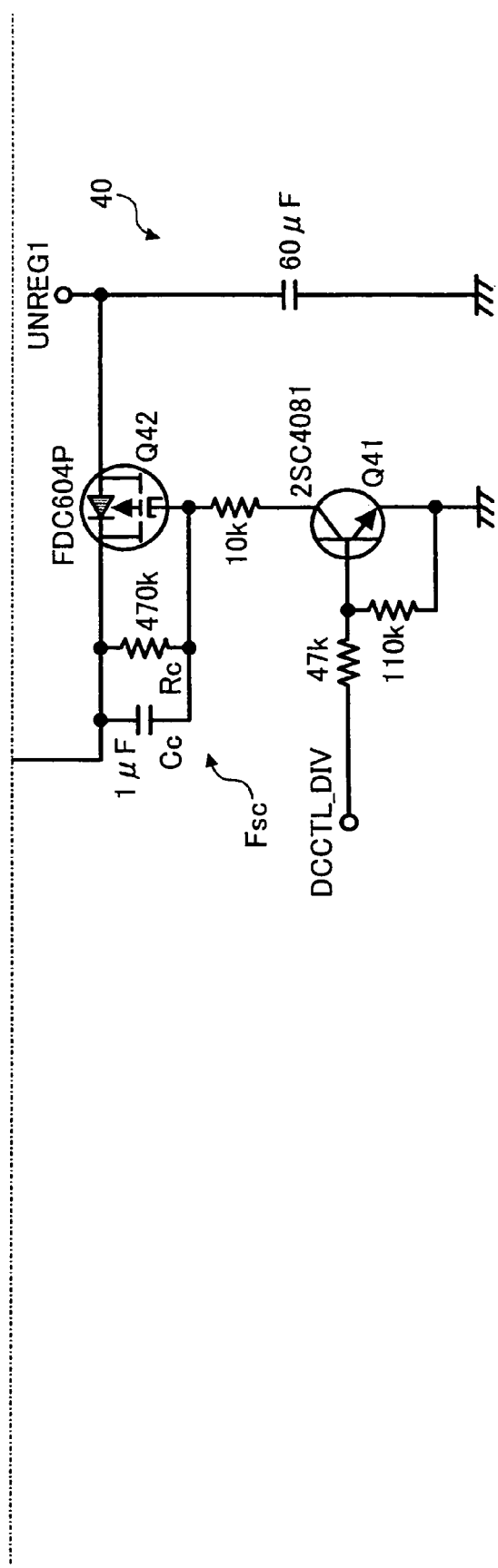

Furthermore, in the above-mentioned electric power unit 10, the parasitic diodes of the MOSFETs Q2 and Q2b in the selecting circuits 13a and 13b are opposite to the electric sources 20a and 20b, but, MOSFETs Q12 and Q12b having parasitic diodes which are normal to the direction from the electric sources 20a and 20b to the UNREG 1 which is the load may be used, as shown in FIGS. 5A and 5B. In this case, it is required that the UNREG 1 is provided with a selecting circuit 40 having a MOSFET Q42 which is disposed between the selecting circuits 13a and 13b and is a parasitic diode having the opposite direction to a loading direction. The selecting circuit 40 is basically the same as the other selecting circuits 13a and 13b, and include a transistor Q41 (2SC4081) for amplifying a small signal in order to amplify control signals, DCCTL_DIV, DCCTL_T3 and so on from the control device 16, MOSFETs Q42a turned on/turned off by the transistor Q41 to connect and block the output of the selecting circuits 13a and 13b and the UNREG 1 which is the load, and a resistor Rc and a condenser Cc connected in parallel with the MOSFETs Q2a and Q2b for achieving a soft start function. The selecting circuit 40 turns on and turns off the MOSFET Q42 by the control signals DCCTL_DIV, DCCTL_T3 from the control device 16 to the transistor Q41 to achieve the connecting and breaking of the electric source-lines, and executes the soft start function by the soft start functional part Fsc comprising the resistor Rc and the condenser Cc when the transistor Q42 is turned on.

Next, an operation of the above-mentioned embodiment is described.

The image recording device 1 having the electric power unit 10 according to the present invention has the structure that the size AA batteries and the lithium batteries are attachable to the plural kinds of electric sources 20a to 20n, the determination as to which of the attached electric sources are connected is executed accurately, and the connected electric sources are connected to a load through the electric source selecting device 13 by use of the soft start function, thereby the safety can be maintained even if the determination is incorrect.

Meanwhile, for clarification and simplification, an example in which the electric source 20a is the lithium battery and the electric source 20b is the size AA battery is explained as follows.

Figure 6B:
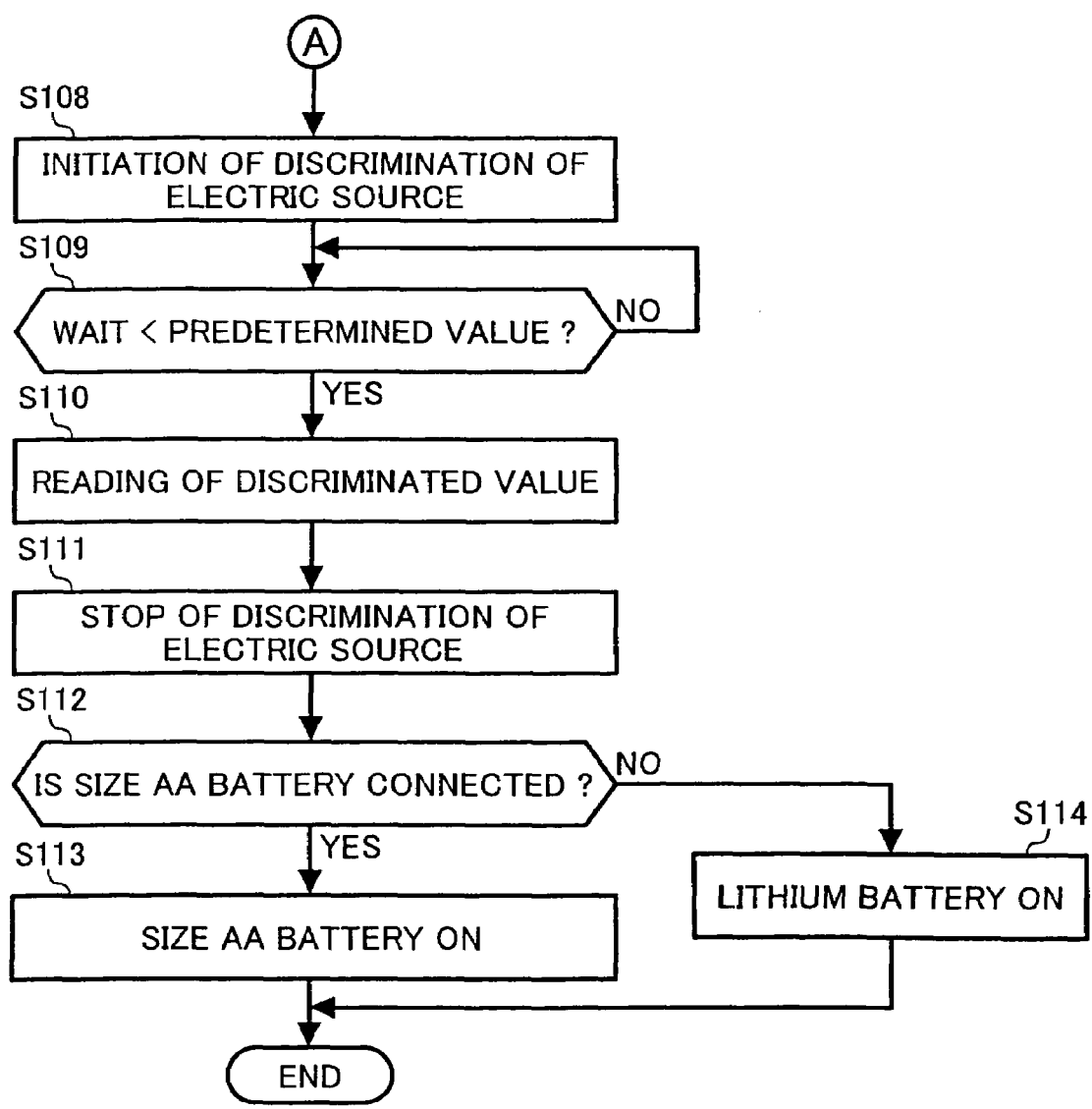
FIG. 6 is a flow chart showing one embodiment of a process for controlling an electric source in the electric power unit shown in FIGS. 1 to 5.

That is to say, when the lithium battery or the size AA battery is used for the electric source 20a or the electric source 20b in the electric power unit 10 (step S101), as shown in FIG. 6, the control device 16 resets a sub CPU (SUB CPU) (step S102) to discharge the residual electric charges stored in the soft start functional part Fsa of the selecting circuit 13a and the soft start functional part Fsb of the selecting circuit 13b. The control device 16 also controls the discharging devices 11a and 14 or the discharging devices 11a and 11b to discharge the residual electric charges on the electric source lines (step S103), reads voltages on the electric sources (step S104), and counts the number of reading or lapsed time (step S105).

An example to which the number of reading is applied will be explained as follows.

When the number of reading is counted, the control device 16 checks whether the reading number is a predetermined number or predetermined value or less (step S106), if it is the predetermined number or less, and then the control device checks whether the electric source voltages are a predetermined voltage or predetermined value or less (step S107).

The control device 16, when the voltages are not the predetermined value or less in the step 107, returns the steps to the step 105, counts the number of the reading, processes the similar steps to the above, and then checks whether the reading number and the electric source voltages reach the predetermined values (steps S105 to S107). When the reading number reaches the predetermined number in the step S106 or the electric source voltages are the predetermined value or less in the step S107, the control device 16 initiates the discrimination of the kind of the electric sources, namely, as to whether they are lithium batteries or the size AA batteries (step S108), after the predetermined time is lapsed (step S109), reads the discriminated values (step S110), stops the discrimination of the electric source voltages (step S111), and checks whether the attached electric sources are the size AA batteries (step S112).

When the size AA batteries are used in the step 112, the control device 16 controls the selecting circuits 13a and 13b to turn on the selecting circuit 13a connected with the electric source 20a to which the size AA battery is applied, and connects the size AA battery with the other unit 30 which is the load to complete the processes for controlling the electric source (step S113).

Moreover, when the size AA batteries are not used in the step S112, the control device 16 determines that the lithium batteries are used and controls the selecting circuits 13a and 13b to turn on the selecting circuit 13b connected with the electric source 20b to which the lithium battery is applied, and connects the lithium battery with the other unit 30 which is the load to complete the processes for controlling the electric source (step S114).

Meanwhile, in the above-mentioned step S106, even if the reading number reaches the predetermined value, when any failures in which the residual electric charges still exist and each discharging device, the control device, the electric source-discriminating device or the electric source-selecting device is not operated occur, when the existence of the residual electric charges is unknown, or when the electric source-discriminating device determines that the plurality of the electric sources are not connected, the control device 16 stops the discharging and discriminating processes, initiates the discrimination of the electric sources and shifts to the process for connecting the electric sources, thereby accomplishing power distribution to the electric power unit 10 certainly, enabling the operation and increasing the availableness.

In addition, in the image recording device 1 having the electric power unit 10 according to the present invention, before the electric source voltages read by the processes for controlling the electric source fall to the predetermined value or less, when the reading number for the electric source reaches the predetermined number or value, the process may be executed as error.

Figure 7B:
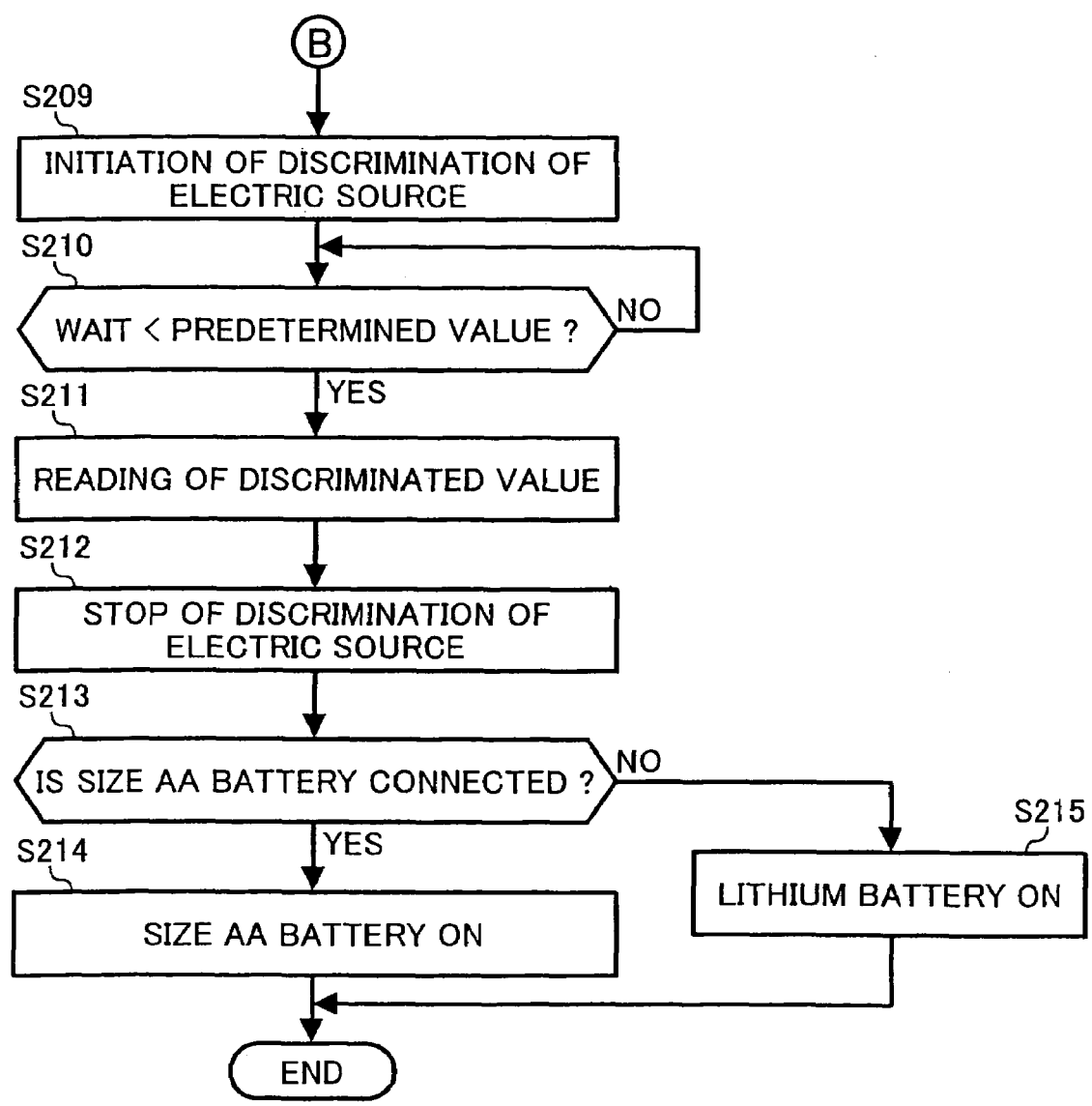
FIG. 7 is a flow chart showing one embodiment of the process for the electric source with an error-process in the electric power unit shown in FIGS. 1 to 5.
Figure 8:
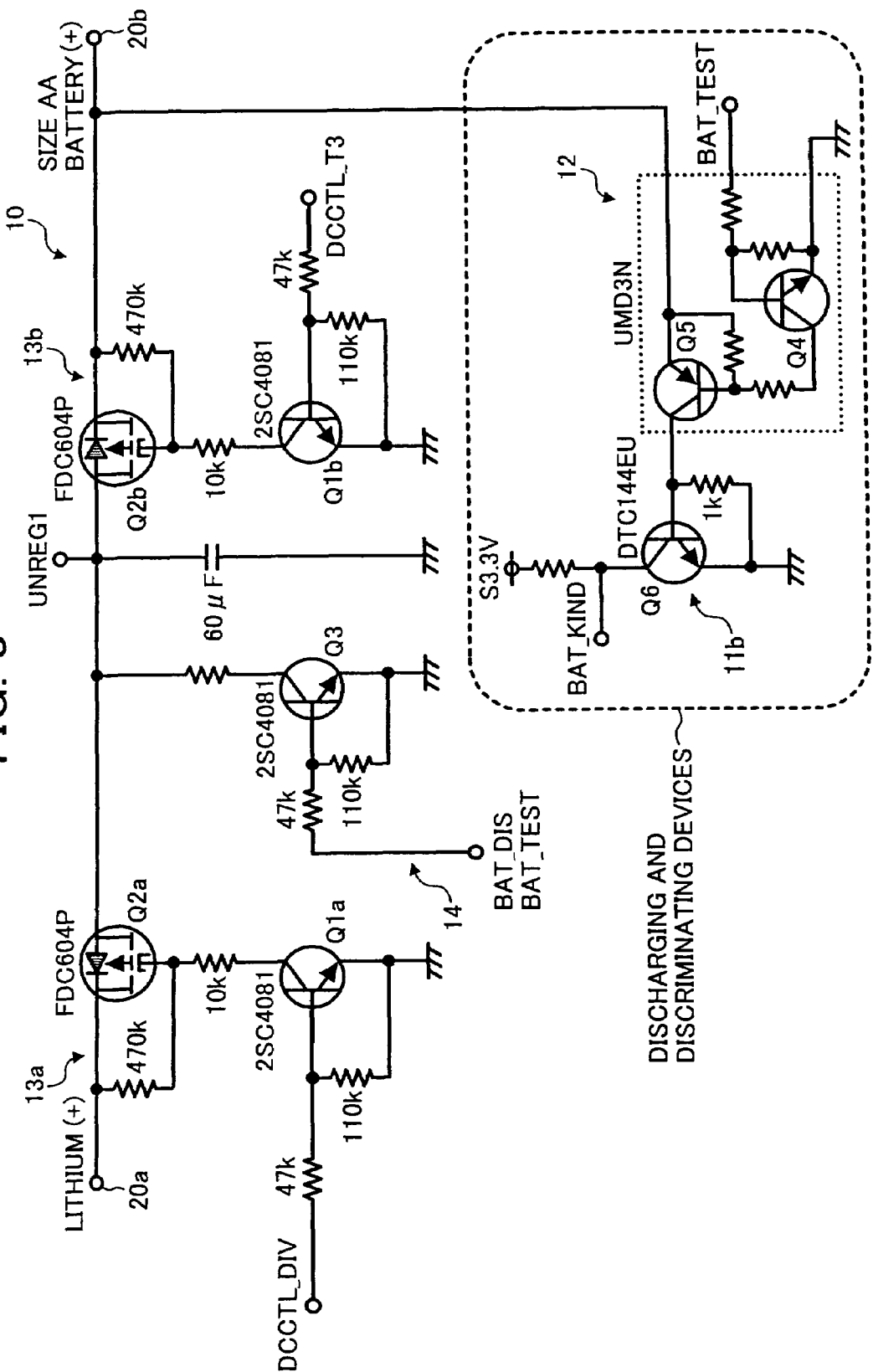
FIG. 8 is a circuit structural view of the electric power unit showing a state in which attached electric sources are lithium batteries or size AA batteries and having no soft start function.
Figure 9:
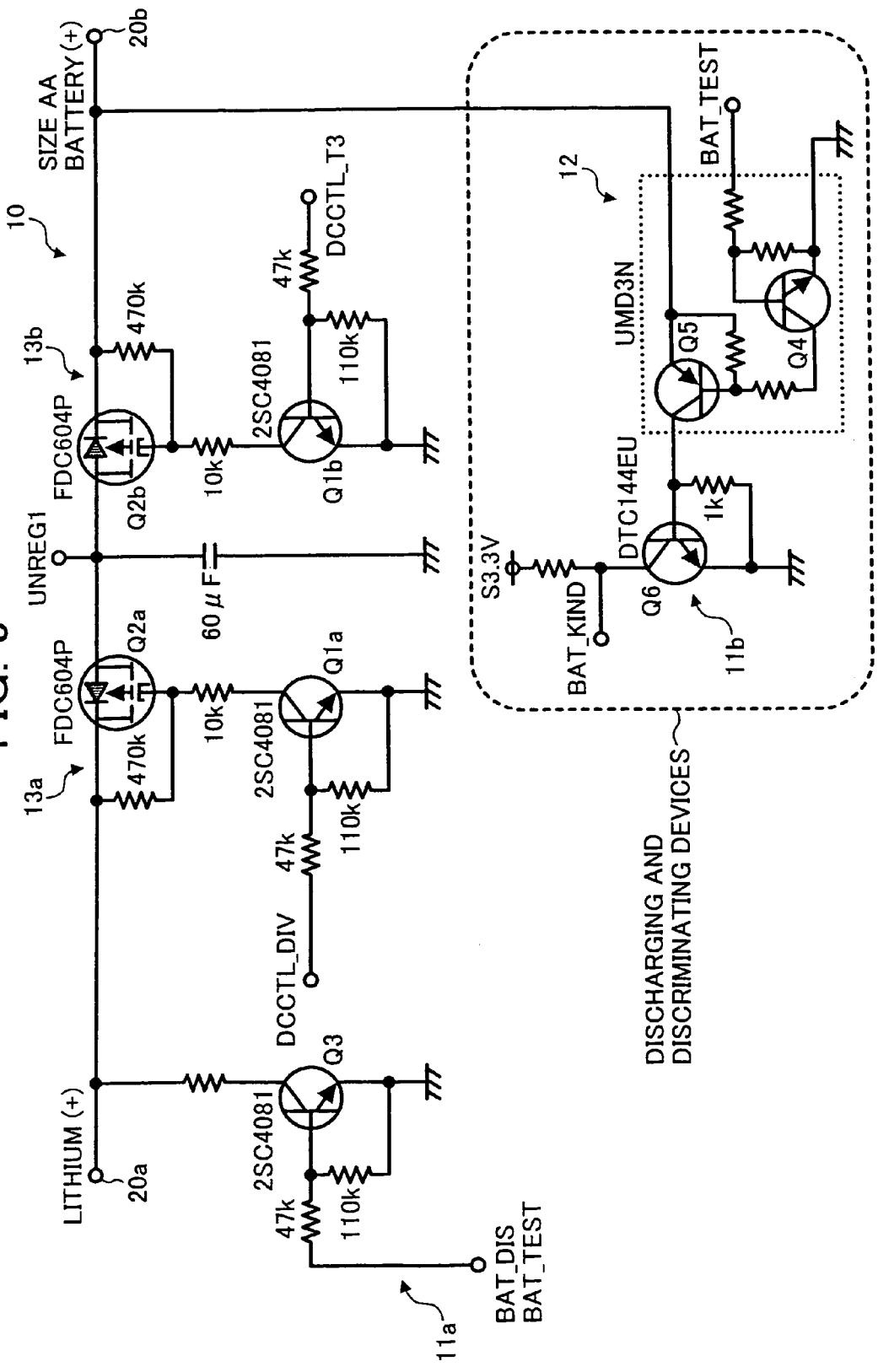
FIG. 9 is a circuit structural view of the electric power unit showing a state in which a discharging device beside the lithium batteries in FIG. 8 is disposed closer to the lithium batteries than an electric source-selecting device.
Figure 10:
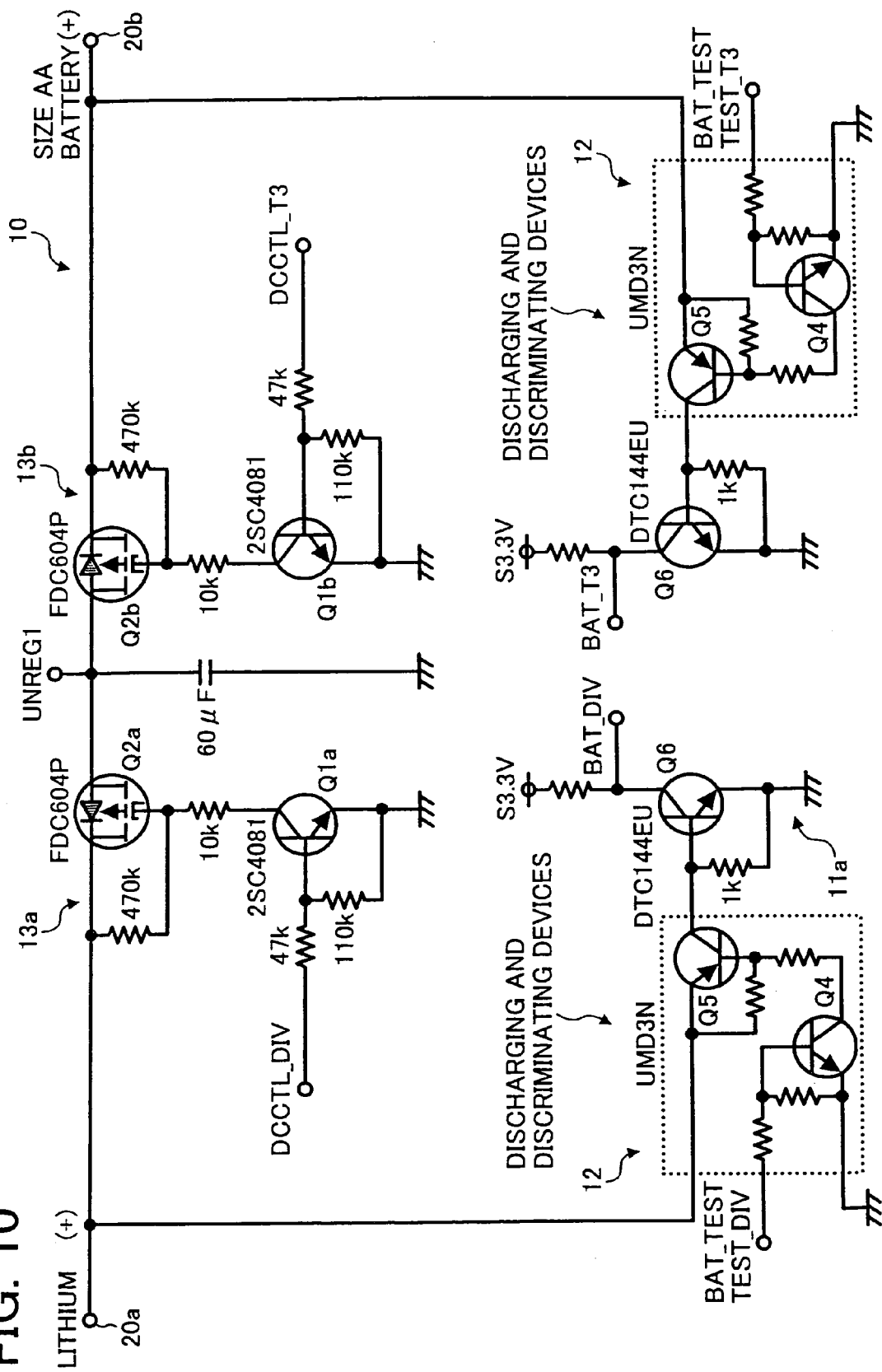
FIG. 10 is a circuit structural view showing the electric power unit shown in FIG. 8, in which the discharging device includes an electric source-discriminating device.
Figure 11:
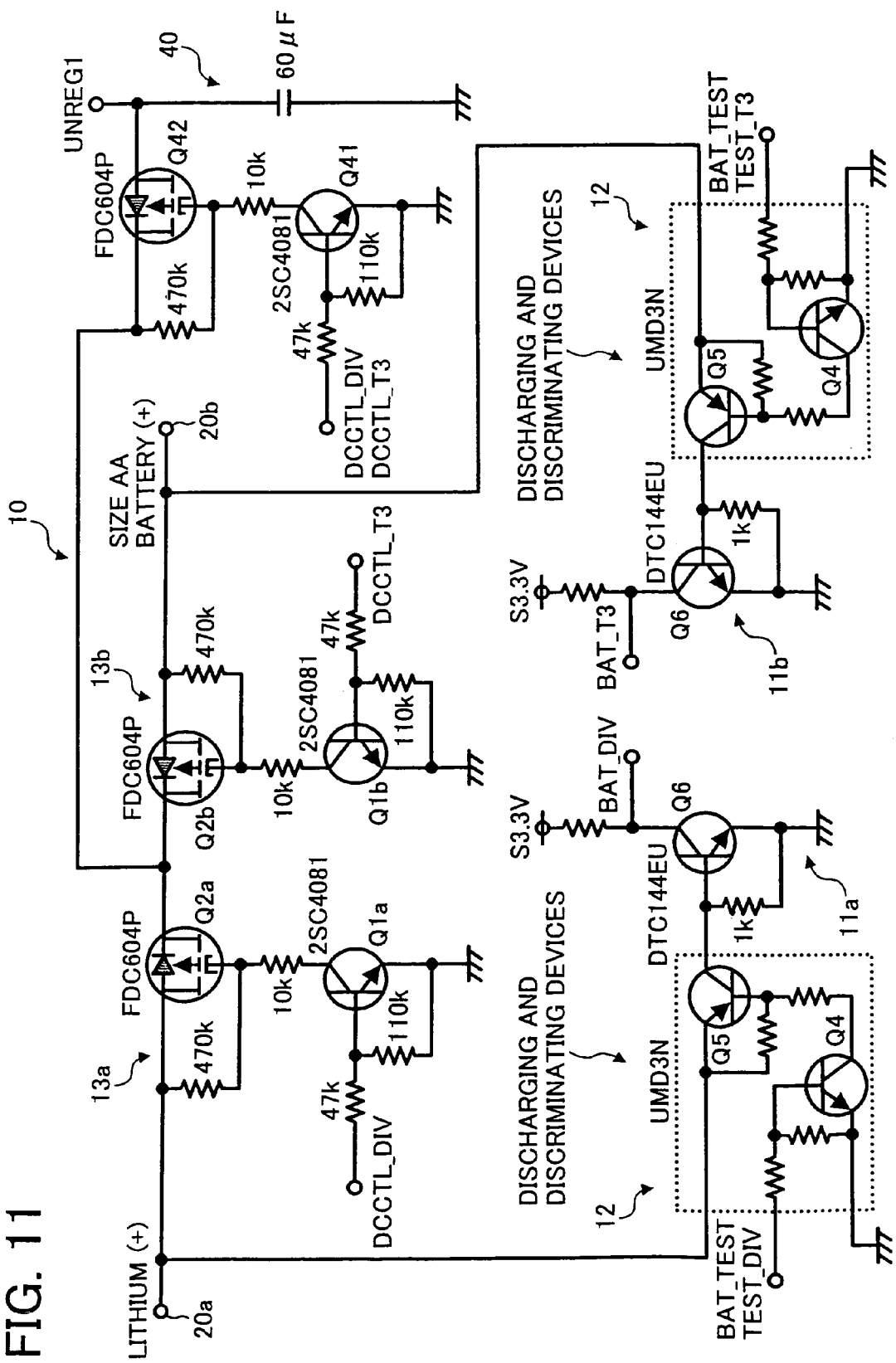
FIG. 11 is a circuit structural view showing the electric power unit shown in FIG. 8, in which parasitic diodes of MOSFETs in the electric source-selecting device are opposite to a normal direction.

That is to say, when the lithium battery or the size AA battery is used for the electric source 20a or the electric source 20b, in the electric power unit 10 (step S 201), as shown in FIG. 7, the control device 16 resets the sub CPU (SUB CPU) (step S 202), discharges the residual electric charges stored in the soft start functional part Fsa of the selecting circuit 13a and the soft start functional part Fsb of the selecting circuit 13b, while controlling the discharging devices 11a and 14, or the discharging devices 11a and 11b to discharge the residual electric charges on the electric source lines (step S 203), executes the reading of the electric source voltages (step S 204) and counts the reading number or the lapsed time (step S 205).

A description based on the reading number will be made as follows.

When the reading number is counted, the control device 16 checks whether the reading number is the predetermined number or less (step S206), when it does not reach the predetermined number, checks whether the electric source voltages are the predetermined voltage or less (step S207).

The control device 16 returns from the step S 207 to the step S205 when the electric source voltages are not the predetermined value or less in the step S207, processes the similar steps to the above beginning at the count of the reading number, checks whether the reading number reaches the predetermined value or the electric source voltages reach the predetermined value (steps S205 to S207), when the reading number reaches the predetermined value in the step S206, before the electric source voltages become the predetermined value or less in the step 207, the control device 16 determines that the discharge of the residual electric charges is insufficient and the detection of the residual electric charges are impossible, and executes an error-process and completes the process (step S208).

As the error-process, for example, there are used the stop of the sequence after the error, an error-warning display to a display such as an LCD (Liquid Crystal Display) or LED (Light Emitting Diode) or the like, an error-warning voice in an acoustic device such as a speaker, buzzer or the like, or an error-warning massage.

A user can conduct an error-release process in accordance with the above error-process. When the insertion of the batteries (electric sources) is executed again, the control device 16 initiates the processes for controlling the electric source beginning at the step S201 again. As the error-release process, there are used the installation and the removal of the batteries or electric sources, or the operation of a reset button, for example.

When the electric source voltages become the predetermined value or less in the step S207 before the reading number reaches the predetermined value in the step S206, the control device 16 initiates the discrimination of the kind of the electric sources, namely, as to whether the electric sources are the lithium batteries or the size AA batteries (step S209), after the predetermined time is lapsed (step S210), reads a discrimination value (step S211), stops the discrimination of the electric source voltages (step S212), and checks whether the attached electric sources are the size AA batteries (step S213).

In the step S213, when the size AA batteries are used, the control device 16 controls the selecting circuits 13a and 13b to turn on the selecting circuit 13a connected with the electric source 20a to which the size AA battery is applied, and connects the size AA battery with the other unit 30 which is the load to complete the processes for controlling the electric source (step S214).

In the step S213, when the size AA batteries are not used, the control device 16 determines when the lithium batteries are used and controls the selecting circuits 13a and 13b to turn on the selecting circuit 13b connected with the electric source 20b to which the lithium battery is applied, and connects the lithium battery with the other unit 30 which is the load to complete the processes for controlling the electric source (step S215).

Next, an electric pour unit having no soft start function will be explained with reference to FIGS. 8 to 13.

FIGS. 8 to 11 correspond to FIGS. 2 to 5, respectively. In an electric power unit 10 shown in each of FIGS. 8 to 11 has no each of the soft start functional parts Fsa, Fsb and Fsc shown in FIGS. 2 to 5.

Figure 12B:
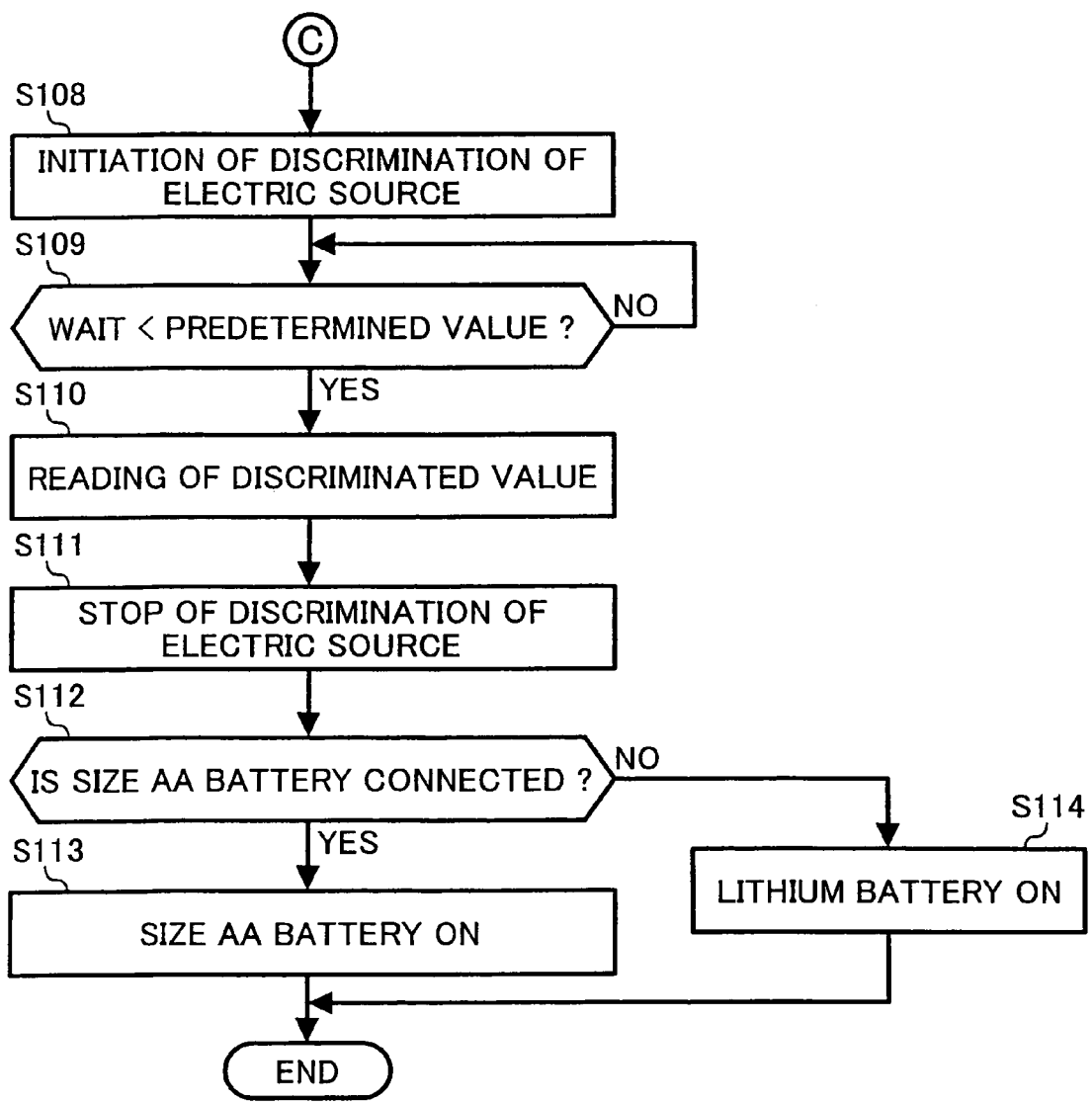
FIG. 12 is a flow chart showing another embodiment of the process for the electric source in the electric power unit shown in FIGS. 8 to 11.

An operation of the electric power unit 10 shown in FIGS. 8 to 11 will be explained with reference to FIG. 12. In FIG. 12, the same step numbers are attached to the similar parts to as in FIG. 6.

When the lithium battery or the size AA battery is used for the electric source 20a or the electric source 20b in the electric power unit 10 (step S101), as shown in FIG. 12, the control device 16 resets the sub CPU (SUB CPU) (step S102) and controls the discharging devices 11a and 14 or the discharging devices 11a and 11b to discharge the residual electric charges on the electric source lines, executes the reading of the electric source voltages (step S103), and counts the number of the reading or lapsed time (step S104). Meanwhile, the following description is made based on the number of the reading.

When the number of reading is counted, the control device 16 checks whether the reading number is a predetermined number or predetermined value or less (step S105), if it is the predetermined number or less, and then the control device checks whether the electric source voltages are a predetermined voltage or predetermined value or less (step S106).

The control device 16, when the voltages are not the predetermined value or less in the step 106, returns the steps to the step 104, counts the number of the reading, processes the similar steps to the above, and then checks whether the reading number and the electric source voltages reach the predetermined values (steps S104 to S106). When the reading number reaches the predetermined number in the step S105 or the electric source voltages are the predetermined value or less in the step S106, the control device 16 initiates the discrimination of the kind of the electric sources, namely, as to whether they are lithium batteries or the size AA batteries (step S107), after the predetermined time is lapsed (step S108), reads the discriminated values (step S109), stops the discrimination of the electric source voltages (step S110), and checks whether the attached electric sources are the size AA batteries (step S111).

When the size AA batteries are used in the step 111, the control device 16 controls the selecting circuits 13a and 13b to turn on the selecting circuit 13a connected with the electric source 20a to which the size AA battery is applied, and connects the size AA battery with the other unit 30 which is the load to complete the processes for controlling the electric source (step S112).

Moreover, when the size AA batteries are not used in the step S111, the control device 16 determines that the lithium batteries are used and controls the selecting circuits 13a and 13b to turn on the selecting circuit 13b connected with the electric source 20b to which the lithium battery is applied, and connects the lithium battery with the other unit 30 which is the load to complete the processes for controlling the electric source (step S113).

Meanwhile, even if the reading number reaches the predetermined value in the above-mentioned step S105, as shown in FIG. 12, when any failures in which the residual electric charges still exist and each discharging device, the control device, the electric source-discriminating device or the electric source-selecting device is not operated occur, when the existence of the residual electric charges is unknown, or when the electric source-discriminating device determines that the plurality of the electric sources are not connected, the control device 16 stops the discharge and discriminating processes, initiates the discrimination of the electric sources and shifts to the process for connecting the electric sources, thereby accomplishing power distribution to the electric power unit 10 certainly, enabling the operation and increasing the availableness.

In addition, in the image recording device 1 having the electric power unit 10 according to the present invention, before the electric source voltages read in the processes for controlling the electric source fall to the predetermined value or less, when the reading number for the electric sources reaches the predetermined number or value, the process may be executed as error.

That is to say, as shown in FIG. 13, when the lithium battery or the size AA battery is used for the electric source 20a or the electric source 20b, in the electric power unit 10 (step S 301), the control device 16 resets the sub CPU (SUB CPU) (step S 302), while controlling the discharging devices 11a and 14, or the discharging devices 11a and 11b to discharge the residual electric charges on the electric source lines (step S 303), and executes the reading of the electric source voltages (step S 304).

A description based on the reading number will be made as follows.

When the reading number is counted, the control device 16 checks whether the reading number is the predetermined number or less (step S305), when it does not reach the predetermined number, checks whether the electric source voltages are the predetermined voltage or less (step S306).

The control device 16, when the source voltages are not the predetermined voltages or less in the step S306, returns the steps to the step S304, processes the similar steps to the above beginning at the count of the reading number, checks whether the reading number reaches the predetermined value or the electric source voltages reach the predetermined value (steps S304 to S306), when the reading number reaches the predetermined value in the step S305, before the electric source voltages become the predetermined value or less in the step 306, the control device 16 determines that the discharge of the residual electric charges is insufficient and the detection of the residual electric charges are impossible, and executes an error-process and completes the process (step S307).

As the error-process, for example, there are used the stop of the sequence after the error, an error-warning display to a display such as an LCD (Uquid Crystal Display) or LED (Light Emitting Diode) or the like, an error-warning voice in an acoustic device such as a speaker, buzzer or the like, or an error-warning massage.

A user can conduct an error-release process in accordance with the above error-process. When the insertion of the batteries (electric sources) is executed again, the control device 16 initiates the processes for controlling the electric source beginning at the step S301 again. As the error-release process, there are used the installation and the removal of the batteries or electric sources, or the operation of a reset button, for example.

When the electric source voltages become the predetermined value or less in the step S306 before the reading number reaches the predetermined value in the step S305, the control device 16 initiates the discrimination of the kind of the electric sources, namely, as to whether the electric sources are the lithium batteries or the size AA batteries (step S308), after the predetermined time is lapsed (step S309), reads a discrimination value (step S310), stops the discrimination of the electric source voltages (step S311), and checks whether the attached electric sources are the size AA batteries (step S312).

In the step S312, when the size AA batteries are used, the control device 16 controls the selecting circuits 13a and 13b to turn on the selecting circuit 13a connected with the electric source 20*a* to which the size AA battery is applied, and connects the size AA battery with the other unit 30 which is the load to complete the processes for controlling the electric source (step S313).

In the step S313, when the size AA batteries are not used, the control device 16 determines that the lithium batteries are used and controls the selecting circuits 13*a* and 13*b* to turn on the selecting circuit 13*b* connected with the electric source 20*b* to which the lithium battery is applied, and connects the lithium battery with the other unit 30 which is the load to complete the processes for controlling the electric source (step S314).

As described above, the image recording device 1 includes the electric power unit 10 having a structure selecting one of the plurality of attachable electric sources 20*a* to 20*n* as the using electric source, discharging the residual electric charges on the electric source lines from the electric sources to the electric source-selecting device 13 having the soft start function or in the soft start functional parts Fsa, Fsb and Fsc of the electric source-selecting device 13, of the electric source lines downstream the electric source-selecting device 13, and executing the discharge of the residual electric charges on the electric source lines to which the electric sources are not connected, or all the electric source lines for the predetermined time or to the predetermined voltage by the discharging devices 11*a* to 11*n* so that the electric source-discriminating device 12 discriminates the attachable electric sources 20*a* to 20*n* and the electric source-selecting device 13 selects the electric sources 20*a* to 20*n* discriminated by the electric source-discriminating device 12 as the using electric source (s).

Consequently, the electric sources is prevent from being discriminated wrong by shifting a load to off of the electric source-selecting device 13 due to the existence of the residual electric charges in the soft start functional parts Fsa, Fsb and Fsc, thereby the attached electric sources 20*a* to 20*n* can be discriminated correctly and rapidly, even if the discrimination is incorrect, it is possible to maintain improved safety by selecting the electric sources 20*a* and 20*n* to which the electric source-selecting device 13 is not connected, although the electricity is not supplied and the operation is not executed merely.

In addition, the image recording device 1 having the electric power unit 10 selects one of the plurality of attachable electric sources 20*a* to 20*n* as the using electric source, discharges the residual electric charges on the electric source lines from the electric sources to the electric source-selecting device 13 having the soft start function or in the soft start functional parts Fsa, Fsb and Fsc of the electric source-selecting device 13, of the electric source lines downstream the electric source-selecting device 13, executes the discharge of the residual electric charges on the electric source lines to which the electric sources are not connected, or all the electric source lines for the predetermined time or to the predetermined voltage by the discharging devices 11*a* to 11*n*, controls the discharging devices to discharge the residual electric charges in the soft start functional parts Fsa, Fsb and Fsc of the selecting circuits 13*a*, 13*b* and 40, and controls the residual electric charge-detecting device 15 to detect the residual electric charges on the electric source lines from the electric sources to the electric source-selecting device 13 and/or electric source lines downstream the electric source-selecting device 13 so that the electric source-discriminating device 12 discriminates the attachable electric sources 20*a* to 20*n* and the electric source-selecting device 13 selects the electric sources 20*a* to 20*n* discriminated by the electric source-discriminating device 12 as the using electric source (s).

Accordingly, it is possible to discriminate the attached electric sources 20*a* to 20*n* correctly and rapidly, even if the discrimination is incorrect, it is possible to maintain increased safety by selecting the electric sources 20*a* and 20*n* to which the electric source-selecting device 13 is not connected, although the electricity is not supplied and the operation is not executed merely.

Moreover, the image recording device 1 having the electric power unit 10 in this embodiment, allows the residual electric charges to discharge by the discharging devices 11*a* to 11*n* and the residual electric charges to detect by the residual electric charge-detecting device 15 while discharging the residual electric charges in the soft start functional parts Fsa, Fsb and Fsc of the selecting circuits 13*a*, 13*b* and 40 or after discharging them, before the attached electric sources 20*a* to 20*n* are discriminated by the electric source-discriminating device 12.

Consequently, unnecessary consumption of the connected electric sources 20*a* to 20*n* is prevented, therefore an electric power saving can be accomplished, and the electric sources can be discriminated correctly by eliminating the residual electric charges or lowering to the predetermined voltage before at least the electric sources are discriminated.

Furthermore, the image recording device 1 having the electric power unit 10 executes the discharge of the residual electric charges by the discharging devices 11*a* to 11*n* and the detection of the residual electric charges by the residual electric charge-detecting device 15 in parallel one another or depending on a predetermined priority, while discharging the residual electric charges in the soft start functional parts Fsa, Fsb and Fsc of the selecting circuits 13*a*, 13*b* and 40 or after discharging them.

Consequently, for example, when the residual electric charges are detected previously and the residual electric charges do not exist, or when lowering to the predetermined voltage, the operation of discharging is not required, hence the discrimination for the electric sources can be accomplished further efficiently. Moreover, when the discharge and detection operations are executed simultaneously, by performing the discharge and the detection of the residual electric charges in the shortest time, it is possible to discriminate the attached electric sources correctly and rapidly increasingly.

Furthermore, the image recording device 1 having the electric power unit 10 stops the discharge process for the residual electric charges in the soft start functional parts Fsa, Fsb and Fsc of the selecting circuits 13*a*, 13*b* and 40, the discharge process by the discharging devices 11*a* to 11*n*, and the detection process by the residual electric charge-detecting device 15, and controls the electric source-selecting device 13 to select at least one electric source, when the residual electric charges detected by the residual electric charge-detecting device 15 are the predetermined value or less, while the detection of the electric sources by the electric discriminating device 12 is impossible.

Accordingly, power distribution to the electric power unit 10 can be achieved certainly, an efficient operation is possible and an increased availableness can be obtained.

In addition, the image recording device 1 having the electric power unit 10 stops the discharge process for the residual electric charges in the soft start functional parts Fsa, Fsb and Fsc of the selecting circuits 13*a*, 13*b* and 40, the discharge process for the residual electric charges by the discharging devices 11*a* to 11*n* and the detection process by the residual electric charge detecting device 15 to execute a predetermined error-process, if an electric source-detectable state is not acquired by the electric source-discriminating device 12 in a predetermined setting condition.

Therefore, a risk can be avoided and the safety can be further improved in the electric power unit.

In the above-mentioned embodiments, although the discharging devices 11a to 11n and the discharging device 14 are provided, the residual electric charge-detecting device 15 is provided only between the electric source-selecting device 13 and the other unit 30, a detecting device similar to the residual electric charge-detecting device 15 may be provided on each electric source line, instead of the discharging devices 11a to 11n, or in parallel with the discharging devices 11a to 11n.

In this embodiment, the residual electric charges on the electric source lines from the electric sources 20a to 20n to the electric source-selecting device 13 or the electric source lines downstream the electric source-selecting device 13 by the similar detecting devices to the residual electric charge-detecting device 15, and the electric source-discriminating device 12 refers to the detected residual electric charges to discriminate the attached electric source(s), and also the electric source-selecting device 13 selects the electric sources 20a to 20n discriminated by the electric source-discriminating device 12 as a using electric source.

Consequently, it is possible to discriminate the attached electric sources 20a to 20n more inexpensively rapidly and correctly, even if the discrimination is incorrect, it is possible to maintain improved safety by selecting the electric sources 20a and 20n to which the electric source-selecting device 13 is not connected, although the electricity is not supplied and the operation is not executed merely.

According to the electric power unit and the electronics device according to the present invention, as shown in the above-mentioned preferred embodiments, the attached electric sources can be discriminated rapidly and correctly, even if the discrimination is incorrect, the safety of the electric power unit can be improved by selecting electric sources, which are not attached, by means of the electric source-selecting device.

Although the preferred embodiments of the present invention have been described, the present invention is not limited to these embodiments; various changes and modifications can be applied to the embodiments.

For example, it is possible to provide an electric power unit in which a plurality of kinds of electric sources are attached removably, and the kind of the attached electric sources can be correctly discriminated correctly to achieve an appropriate electric supply, and an electric device such as an image recording device of a digital camera, a printer or the like, to which the electric power unit is applied.

What is claimed is:

1. An electric power unit, comprising:
   a plurality of electric sources;
   a plurality of electric source lines connected to the plurality of electric sources, respectively;
   a discriminating device configured to detect about whether or not at least one of the electric source is connected to any of the plurality of electric source lines;
   a selecting device configured to select one of the plurality of electric source lines as a using electric source line;
   a first discharging device configured to discharge a residual electric charge in each of the plurality of electric source lines from the electric sources to the selecting device;
   a second discharging device configured to discharge a residual electric charge in each of the plurality of electric source lines after the selecting device; and
   a detecting device configured to detect any of the residual electric charges on the electric source lines from the electric sources to the selecting device and after the selecting device,
   wherein the discriminating device is configured to discriminate the electric source connected to the electric source line, based on the discharge of the residual electric charge in each of the plurality of electric source lines from the electric sources to the selecting device, the discharge of the residual electric charge in each of the plurality of electric source lines after the selecting device and the detection of the residual electric charge in each of the plurality of electric source lines after the selecting device, and the selecting device is configured to select the electric source line discriminated by the discriminating device as the using electric source line.

2. The electric power unit according to claim 1,
   wherein the detecting device is configured to detect a degree of the residual electric charge in each of the electric source lines from the electric sources to the selecting device.

3. The electric power unit according to claim 1,
   wherein the detecting device is configured to detect a degree of the residual electric charge in each of the electric source lines after the selecting device.

4. An electric power unit, comprising:
   a plurality of electric source;
   a plurality of electric source lines connected to the plurality of electric sources, respectively;
   a discriminating device configured to detect about whether or not at least one of the electric source is connected to any of the plurality of electric source lines;
   a selecting device configured to select one of the plurality of electric source lines as a using electric source line;
   a first discharging device configured to discharge a residual electric charge in each of the plurality of electric source lines from the electric sources to the selecting device;
   a second discharging device configured to discharge a residual electric charge in each of the plurality of electric source lines after the selecting device; and
   a detecting device configured to detect any of the residual electric charges on the electric source lines from the electric sources to the selecting device and after the selecting device,
   wherein the discriminating device is configured to discriminate the electric source connected to the electric source line, based on the discharge of the residual electric charge in each of the plurality of electric source lines from the electric sources to the selecting device, the discharge of the residual electric charge in each of the plurality of electric source lines after the selecting device, the detection of the residual electric charge in each of the plurality of electric source lines from the electric sources to the selecting device and the detection of the residual electric charge in each of the plurality of electric source lines after the selecting device, and the selecting device is configured to select the electric source line discriminated by the discriminating device as the using electric source line.

5. The electric power unit according to claim 4,
   wherein the control device, when the residual electric charge is reduced to a predetermined setting value and the detection of the using electric source by the discriminating device is not in a possible state, stops at least one of the discharge of the residual electric charge and the detection of the residual electric charge, and controls the selecting device to select at least one electric source.

6. The electric power unit according to claim 4,
wherein the control device further includes an error processing device configured to perform a predetermined error process when an error is recognized in a predetermined setting condition, wherein the control device, when the detection of the using electric source by the discriminating device is not in a possible state, stops at least one of the discharge of the residual electric charge and the detection of the residual electric charge, and the error processing device performs a predetermined error process.

* * * * *